(12) United States Patent
Do et al.

(10) Patent No.: US 12,131,999 B2
(45) Date of Patent: Oct. 29, 2024

(54) SEMICONDUCTOR DEVICE

(71) Applicant: Samsung Electronics Co., Ltd., Suwon-si (KR)

(72) Inventors: Jungho Do, Suwon-si (KR); Sanghoon Baek, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/512,527

(22) Filed: Nov. 17, 2023

(65) Prior Publication Data

US 2024/0088039 A1   Mar. 14, 2024

Related U.S. Application Data

(63) Continuation of application No. 17/323,407, filed on May 18, 2021, now Pat. No. 11,842,964.

(30) Foreign Application Priority Data

Aug. 18, 2020  (KR) ........................ 10-2020-0103160

(51) Int. Cl.
| | |
|---|---|
| *H01L 23/528* | (2006.01) |
| *H01L 27/02* | (2006.01) |
| *H01L 27/092* | (2006.01) |
| *H01L 29/423* | (2006.01) |
| *H01L 29/786* | (2006.01) |

(52) U.S. Cl.
CPC ...... *H01L 23/5286* (2013.01); *H01L 27/0207* (2013.01); *H01L 27/092* (2013.01); *H01L 29/42392* (2013.01); *H01L 29/78696* (2013.01)

(58) Field of Classification Search
CPC ............ H01L 23/5286; H01L 27/0207; H01L 27/092; H01L 29/42392; H01L 29/78696; H01L 21/76895; H01L 27/0924; H01L 23/481; H01L 23/485; H01L 23/528; H01L 23/535; H01L 27/11807; H01L 2027/11875; H01L 27/0203; H01L 27/085; H01L 21/823821; H01L 21/823871; G06F 30/39
USPC ........................................................ 257/369
See application file for complete search history.

(56) References Cited

U.S. PATENT DOCUMENTS

| | | | |
|---|---|---|---|
| 9,626,472 B2 | 4/2017 | Chiang et al. | |
| 10,275,559 B2 | 4/2019 | Wang et al. | |
| 11,842,964 B2 * | 12/2023 | Do | ........................ H01L 27/092 |

(Continued)

*Primary Examiner* — Tong-Ho Kim
(74) *Attorney, Agent, or Firm* — Harness, Dickey & Pierce, P.L.C.

(57) ABSTRACT

A semiconductor device includes a substrate having an active region, a first group of standard cells arranged in a first row on the active region of the substrate and having a first height defined in a column direction, a second group of standard cells arranged in a second row on the active region of the substrate, and having a second height, and a plurality of power lines extending in a row direction and respectively extending along boundaries of the first and the second groups of standard cells. The first and second groups of standard cells each further include a plurality of wiring lines extending in the row direction and arranged in the column direction, and at least some of wiring lines in at least one standard cell of the first and second groups of standard cells are arranged at different spacings and/or pitches.

20 Claims, 22 Drawing Sheets

(56) References Cited

U.S. PATENT DOCUMENTS

| | | |
|---|---|---|
| 2013/0313615 A1 | 11/2013 | Tzeng et al. |
| 2015/0095870 A1 | 4/2015 | Chen et al. |
| 2018/0342462 A1 | 11/2018 | Kuchanuri et al. |
| 2019/0035811 A1 | 1/2019 | Chang et al. |
| 2019/0148407 A1 | 5/2019 | Guo et al. |
| 2019/0155984 A1 | 5/2019 | Chen et al. |
| 2020/0042668 A1 | 2/2020 | Peng et al. |
| 2020/0104451 A1 | 4/2020 | Huang et al. |

\* cited by examiner

SEMICONDUCTOR DEVICE

CROSS-REFERENCE TO RELATED APPLICATION(S)

This is a continuation of U.S. application Ser. No. 17/323,407, filed May 18, 2021, which claims priority to Korean Patent Application No. 10-2020-0103160 filed on Aug. 18, 2020, the disclosures of each of which are hereby incorporated by reference in their entirety.

BACKGROUND

Some example embodiments relate to a semiconductor device.

As demand for high performance, high speed and/or multifunctionality in semiconductor devices increases, the degree of integration of semiconductor devices is increasing. In accordance with the trend for high integration of semiconductor devices, research into layout design, in detail, efficient muting of metal wires for connecting semiconductor devices, is being actively conducted.

SUMMARY

Some example embodiments provide a semiconductor device having metal wiring efficiently designed in a highly integrated semiconductor device layout.

According to some example embodiments, a semiconductor device includes a substrate having an active region, a plurality of standard cells on the active region of the substrate, the plurality of standard cells arranged in a plurality of rows, the plurality of rows extending in a first direction, the plurality of standard cells each including an active pattern extending in the first direction, a gate structure intersecting the active pattern and extending in a second direction that intersects the first direction, a plurality of source/drain regions in the active pattern with one of the plurality of source/drain regions on one side of the gate structure and another of the plurality of source/drain regions on another side of the gate structure, and contact structures respectively connected to the source/drain regions and extending in a third direction that is perpendicular to an upper surface of the substrate, and a plurality of power lines respectively extending in the first direction along boundaries of the plurality of standard cells, the plurality of power lines configured to supply power to the plurality of standard cells. Each of the plurality of standard cells further includes a plurality of wiring lines extending in the first direction and arranged in the second direction. At least some neighboring wiring lines of the plurality of wiring lines in at least one standard cell among the plurality of standard cells are arranged at different spacings and/or different pitches.

According to some example embodiments, a semiconductor device includes a substrate having an active region, a first group of standard cells arranged in a first row on the active region of the substrate and having a first height defined in a column direction, a second group of standard cells arranged in a second row on the active region of the substrate, the second group of standard cells having a second height defined in the column direction, the second height different from the first height, and a plurality of power lines extending in a row direction and respectively extending along boundaries of the first group of standard cells and the second group of standard cells. The first and second groups of standard cells each include a plurality of wiring lines extending in the row direction and arranged in the column direction. At least some neighboring wiring lines of the plurality of wiring lines in at least one standard cell of the first and second groups of standard cells are arranged at different spacings and/or pitches.

According to some example embodiments, a semiconductor device includes a substrate having an active region, a plurality of standard cells on the active region of the substrate, the plurality of standard cells arranged in a plurality of rows extending in a first direction, the plurality of standard cells each including an active pattern extending in the first direction, a gate structure intersecting the active pattern and extending in a second direction intersecting the first direction, source/drain regions in the active pattern on a first side of the gate structure and on a second side of the gate structure, and contact structures respectively connected to the source/drain regions and extending in a third direction perpendicular to an upper surface of the substrate, and a plurality of power lines respectively extending in the first direction along boundaries of the plurality of standard cells, a boundary of adjacent rows among the plurality of rows being shared by standard cells of the adjacent rows. Each of the plurality of standard cells further includes a plurality of wiring lines extending in the first direction and arranged in the second direction. The plurality of power lines include a plurality of first power lines arranged on a level above an upper surface of the contact structure, and a plurality of second power lines buried in the active region. The contact structures include a first contact structure connected to the first power line by a conductive via, and a second contact structure having an extension portion extending in the second direction, the second portion connected to the second power line.

BRIEF DESCRIPTION OF DRAWINGS

The above and other aspects, features, and advantages of some example embodiments will be more clearly understood from the following detailed description, taken in conjunction with the accompanying drawings, in which.

DETAILED DESCRIPTION OF SOME EXAMPLE EMBODIMENTS

Hereinafter, various example embodiments will be described in detail with reference to the accompanying drawings.

Figure 1:
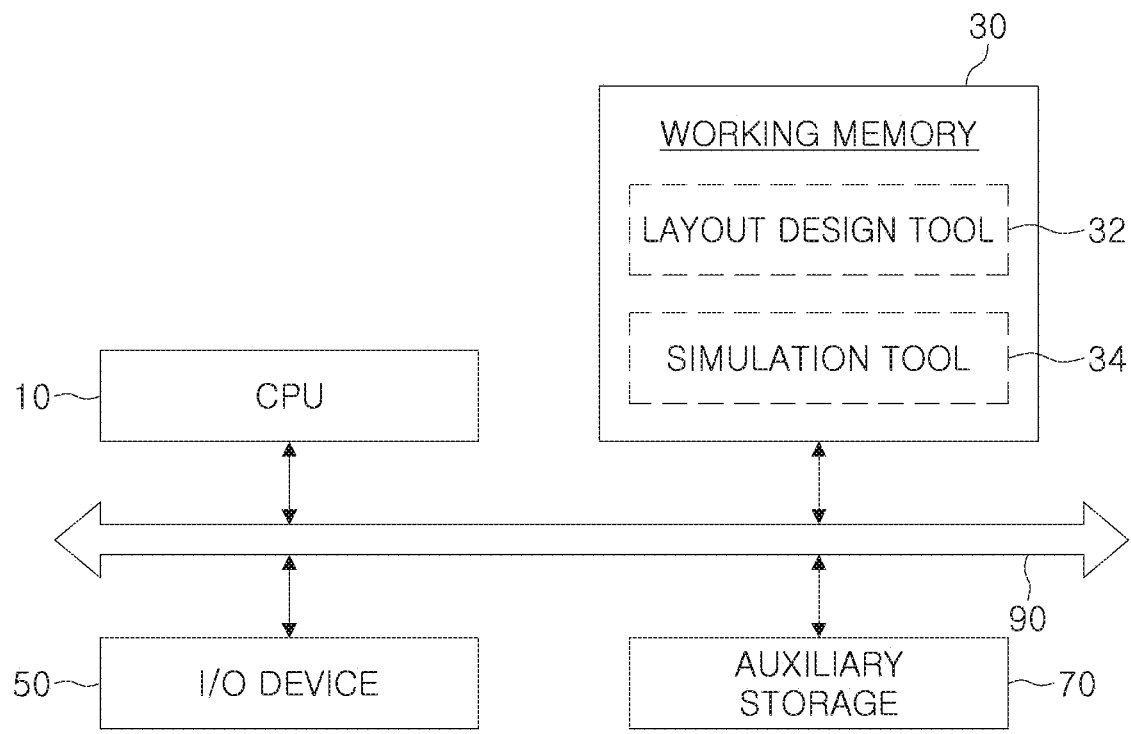
FIG. 1 is a block diagram illustrating a computer system for performing semiconductor design according to some example embodiments.

FIG. 1 is a block diagram illustrating a computer system for performing semiconductor design according to some example embodiments.

Referring to FIG. 1, a computer system may include a CPU 10, a working memory 30, an input/output device 50, and a storage device 70. In this case, the computer system may be a device for layout design according to some example embodiments. The computer system may additionally include various design and verification simulation programs.

The CPU 10 may execute software (application programs, an operating system, device drivers) to be executed in a computer system. The CPU 10 may execute an operating system (OS) loaded in the working memory 30. The CPU 10 may execute various application programs (AP) to be driven based on the operating system. For example, the CPU 10 may execute a layout design tool 32 loaded in the working memory 30.

The operating system or the application programs may be loaded into the working memory 30. When the computer system boots, the OS image stored in the storage device 70 may be loaded into the working memory 30 based on a boot sequence. The operating system may support various input/output operations of the computer system. Similarly, the application programs may be loaded into the working memory 30, to be selected by a user and/or to provide basic services. In detail, the layout design tool 32 for layout design according to some example embodiments may also be loaded from the storage device 70 to the working memory 30.

The layout design tool 32 may have a biasing function capable of changing the shape and/or position of specific layout patterns differently from those defined by design rules. Alternatively or additionally, the layout design tool 32 may perform a design rule check (DRC) under the changed biasing data condition. The working memory 30 may be a volatile memory such as a static random access memory (SRAM) and/or a dynamic random access memory (DRAM), and/or a nonvolatile memory such as at least one of PRAM, MRAM, ReRAM, FRAM, or NOR flash memory.

The working memory 30 may further include a simulation tool 34 performing Optical Proximity Correction (OPC) on the designed layout data. The OPC may include modifications of the design layout to include features such as at least one of subresolution assist features (SRAF)'s including in riggers and/or outriggers, serifs or negative-serifs; however, example embodiments are not limited thereto.

The input/output device 50 controls user input and output from user interface devices. For example, the input/output device 50 may include a keyboard and/or a monitor such as a touch-screen monitor to receive information from a designer. Using the input/output device 50, a designer may receive information on a semiconductor region and/or data paths requiring adjusted operating characteristics. Further, the processing process and/or processing result of the simulation tool 34 may be displayed through the input/output device 50.

The storage device 70 is provided as a storage medium of a computer system. The storage device 70 may store at least one of application programs, an operating system image, and various data. The storage device 70 may be provided as a memory card (e.g., MMC, eMMC, SD, Micro SD, or the like) or a hard disk drive (HDD). The storage device 70 may include a NAND-type flash memory having a large storage capacity. Alternatively or additionally, the storage device 70 may include a next-generation nonvolatile memory such as PRAM, MRAM, ReRAM, FRAM or the like, or a NOR flash memory.

A system interconnector 90 may be or may include a system bus for providing a network inside of a computer system. The CPU 10, the working memory 30, the input/output device 50, and the storage device 70 are electrically connected to each other through the system interconnector 90, and may exchange data with each other. However, the configuration of the system interconnector 90 is not limited to the above description, and may further include other processing circuitry such as arbitration units for efficient management.

Figure 2:
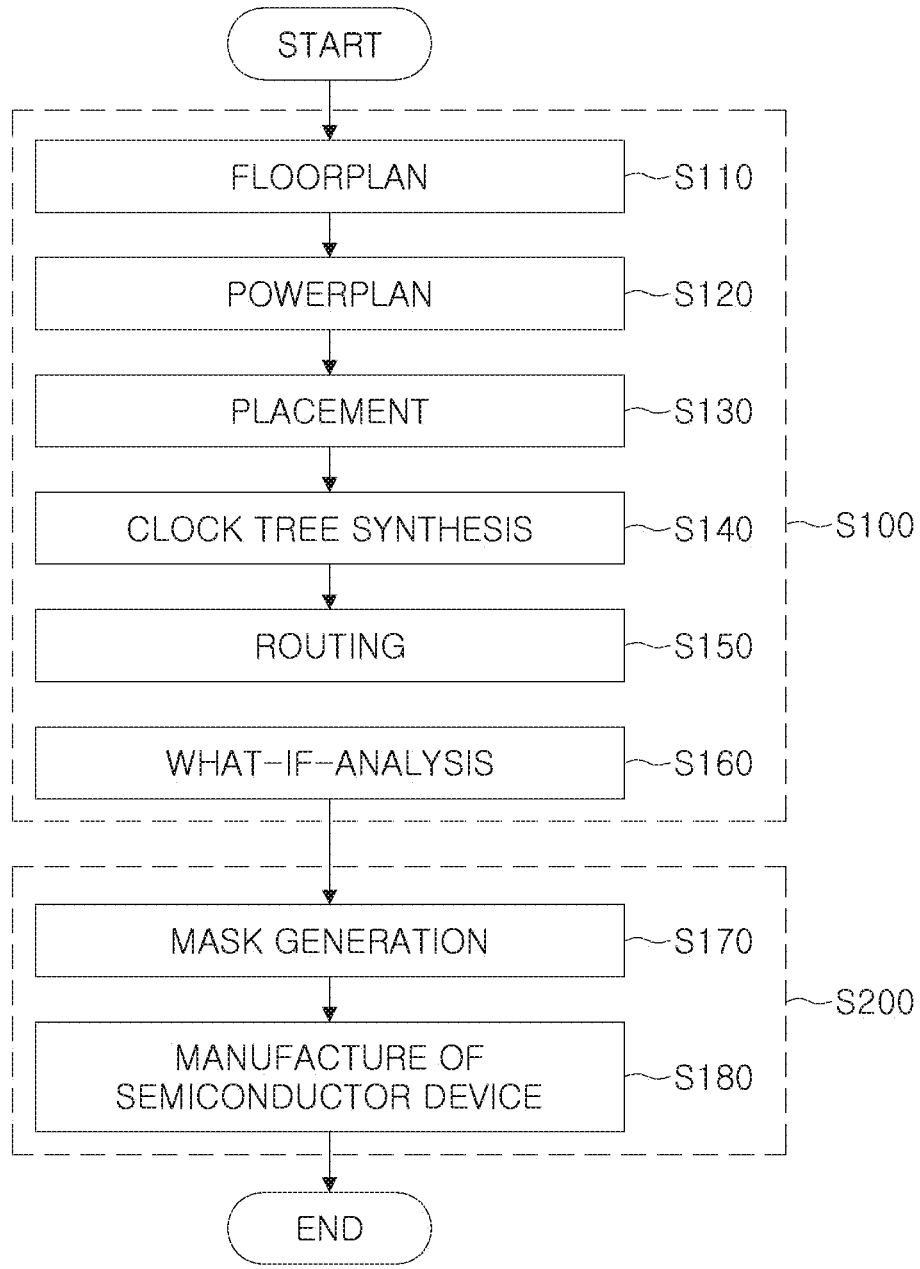
FIG. 2 is a flowchart illustrating a method of designing and manufacturing a semiconductor device according to some example embodiments.

FIG. 2 is a flowchart illustrating a method of designing and manufacturing a semiconductor device according to some example embodiments, and the design method may be implemented by the above-described computer system.

Referring to FIG. 2, a method of designing and manufacturing, e.g. fabricating, a semiconductor device according to some example embodiment may include a designing operation S100 of a semiconductor device and a manufacturing process operation S200 of the semiconductor device.

The designing operation S100 of the semiconductor device is or corresponds to an operation of designing a layout for a circuit, and may be performed using a tool for designing a circuit. The tool may be a program including a plurality of instructions executed by a processor. Accordingly, the designing operation S100 of the semiconductor device may be or may include a computer implemented operation for designing a circuit. The manufacturing process operation S200 of the semiconductor device is an operation of manufacturing, e.g. fabricating, a semiconductor device based on the designed layout, and may be performed in a semiconductor process module.

Referring to FIG. 2, first, the designing operation S100 of the semiconductor device may include a floorplan operation S110, a power plan operation S120, a placement operation S130, and a clock tree synthesis (CTS) operation S140, a routing operation S150, and a virtual analysis (what-if-analysis) operation S160.

The floor plan operation S110 may be or correspond to an operation of performing physical designing by cutting and moving a logically designed schematic circuit. In the floor plan operation S110, a memory and/or a functional block may be disposed. In the floor plan operation S110, for example, functional blocks to be disposed adjacent to each other may be identified, and space for the functional blocks may be allocated in consideration of available space, required performance and the like. For example, the floor plan operation S110 may include generating a site-row and forming a metal routing track on the generated site-row. The site-row is/includes a frame for disposing standard cells stored in a cell library according to a prescribed design rule. Standard cells having the same height may be disposed in respective rows. A site for disposing the standard cells may be provided such that standard cells of some rows may have a height different from that of standard cells of other rows.

The power plan operation S120 may be an operation of disposing patterns of wirings connecting a local power source, for example, a driving voltage and/or a ground, to the disposed functional blocks. For example, patterns of wirings connecting power and/or ground may be generated such that power may be evenly supplied to the entire chip in the form of a net. As used herein, the patterns may also be referred to as a power rail or a power line. In the power plan operation S120, the wirings may be generated in a net form through various rules.

The placement operation S130 is an operation of disposing patterns of elements constituting the functional block, and may include disposing standard cells. In detail, in some example embodiments, each of the standard cells may include semiconductor elements and first wiring lines connected thereto. The first wiring lines may include a power transmission line connecting power or ground, and a wiring line transmitting a control signal, an input signal or an output signal. Blank areas, e.g. dummy areas, may occur between the standard cells disposed in this operation, and the blank areas may be filled by filler cells, e.g. dummy cells. Unlike the standard cells including an operable semiconductor element and a unit circuit implemented by the semiconductor elements, the filler cells may be or correspond to a dummy region, e.g. a region that is not active during operation of the semiconductor element. The dummy region may be empty, or alternatively may include certain elements such as pedestals that are not electrically active (e.g. that float), but that nonetheless help in the fabrication of the semiconductor device. By this operation, the shape and/or size of a pattern for configuring transistors and wirings to be actually formed on a semiconductor substrate may be defined. For example, to form an inverter circuit on a semiconductor substrate, layout patterns such as PMOS, NMOS, N-WELL, gate electrodes and/or wirings to be disposed thereon, may be appropriately placed on the layout.

The CTS operation S140 may be or correspond to an operation of generating patterns of signal lines of a center clock related to a response time determining the performance of the semiconductor device. Subsequently, the routing operation S150 may be or correspond to an operation of generating a routing structure or an upper wiring structure including second wiring lines connecting the disposed standard cells. In detail, a power distribution network (PDN) may be implemented in this operation. The second wiring lines are electrically connected to the first wiring lines in the standard cells, and electrically connect the standard cells to each other, or may be connected to power or ground. The second wiring lines may be configured to be physically formed on the first wiring lines.

The virtual analysis operation S160 may be or correspond to an operation of verifying and correcting the generated layout. The items to be verified may include at least one of a Design Rule Check (DRC) to verify that the layout is properly in accordance with the design rules, an Electronic Rule Check (ERC) to verify that the layout is appropriate without electrical disconnection, and Layout vs Schematic (LVS) to check whether the layout matches the gate level net list. Although FIG. 2 illustrates that the design process S100 is performed linearly, e.g. from S110 to S160, example embodiments are not limited thereto. For example, the order of operations may be variable; alternatively or additionally, many operations may be iteratively performed.

Subsequently, the manufacturing process operation S200 of the semiconductor device may include a mask generating operation S170 (e.g. a tape-out operation) and a manufacturing operation S180 (e.g. a fabrication operation) of the semiconductor device.

The mask generation operation S170 may include generating mask data for forming various patterns on a plurality of layers by performing optical proximity correction (OPC) and/or dummy fill and/or the like on the layout data generated in the semiconductor device design operation S100; and manufacturing, e.g. cutting, a mask using the mask data. The optical proximity correction may be for correcting a distortion phenomenon/diffraction phenomenon that may occur in a photolithography process. The mask may be manufactured in a manner depicting layout patterns using an opaque metal such as chromium thin film applied on a transparent substrate such as a glass and/or quartz substrate.

In the manufacturing operation S180 of the semiconductor device, various types of exposure, etching and/or implanting processes may be repeatedly performed. Through these processes, pattern forms formed during layout design may be sequentially formed on a semiconductor substrate such as silicon, e.g. a silicon wafer. In detail, a semiconductor device in which an integrated circuit implemented may be formed by performing various semiconductor processes on a semiconductor substrate such as a wafer by using a plurality of masks. The semiconductor process employed in some example embodiments may be performed by a lithography process using light such as extreme ultraviolet (EUV), and since a mask is manufactured using the lithography process, the pitch, spacing, and/or line width of the patterns may be freely set. The pitch may correspond to a distance of neighboring patterns, such as neighboring wires, such as the center-line of neighboring patterns. The pitch may be or correspond to a periodic distance, e.g. a repeating distance between the center-line of neighboring patterns; however, example embodiments are not limited thereto, and the pitch may correspond to a center-to-center distance of only two neighboring patterns. The spacing may correspond to a distance, such as an edge-to-edge distance, of neighboring patterns such as neighboring wires. The line widths may correspond to a distance, such as an edge-to-edge distance, of a pattern such as a wire. In addition, the semiconductor process may include a deposition process, an etching process, an ion implantation process, a cleaning process, and the like. In addition, the semiconductor process may include a packaging process of mounting a semiconductor device on a PCB to be sealed with an encapsulant, and/or may include a probing process/testing process for the semiconductor device or a package thereof.

Figure 3:
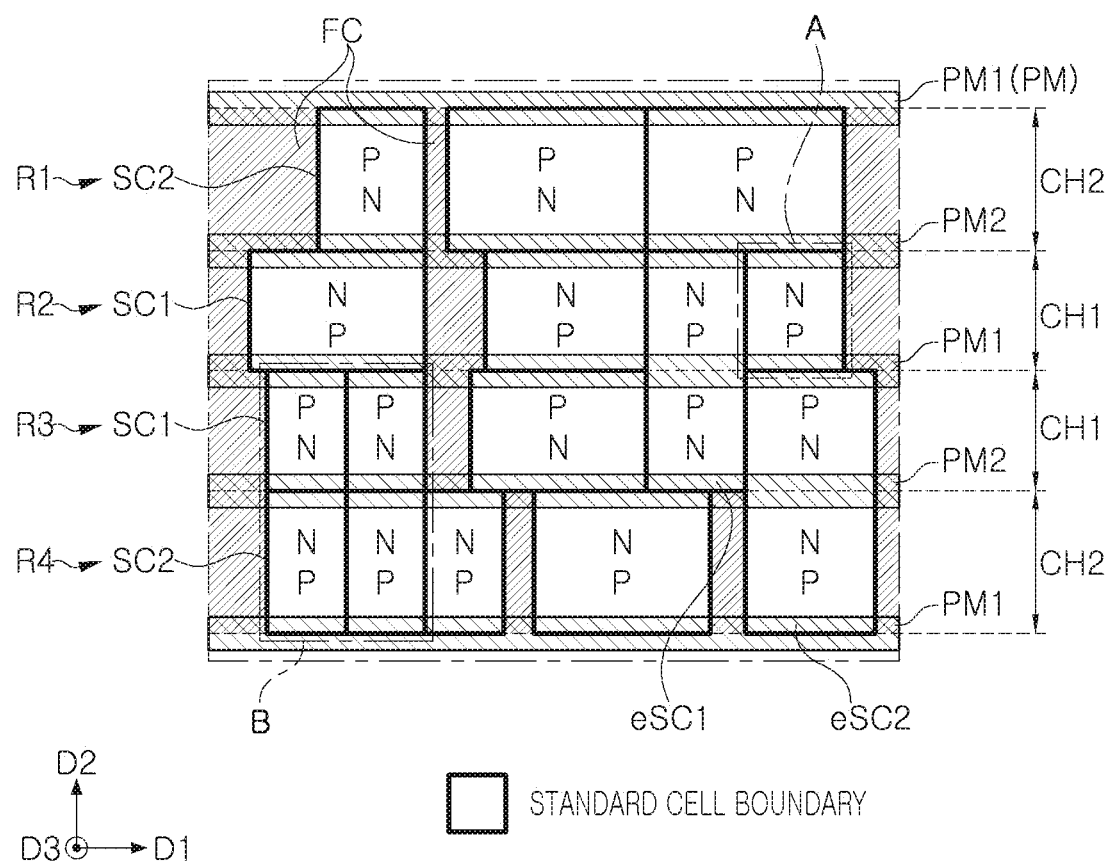
FIG. 3 is a layout diagram of a semiconductor device according to some example embodiments.

FIG. 3 is a schematic plan view of a semiconductor device 300 according to some example embodiments.

Referring to FIG. 3, the semiconductor device 300 according to some example embodiments may include standard cells SC and filler cells FC provided as a dummy region. The standard cells SC respectively extend in a first direction D1, and may be arranged in four rows arranged in a second direction D2 perpendicular to the first direction D1, respectively.

The standard cell layout illustrated in FIG. 3 is a layout designed according to the method described with reference to FIG. 2, but may be understood as a plane of an actual semiconductor device manufactured (fabricated) based on the layout. In this respect, the "standard cell" may also be referred to as a "logic cell." In addition, for convenience of description, a detailed cell structure (e.g., see FIG. 4A) and wiring lines (e.g., see FIG. 4B) other than the power lines PM are omitted.

The standard cells SC1 and SC2 arranged in first to fourth rows R1, R2, R3 and R4 may have cell heights CH1 and CH2 defined in the second direction D2, respectively. The standard cells SC1 and SC2 located in the same row may have the same cell height (CH1, CH2), and the cell height CH1 of the standard cells SC1 located in some rows R2 and R3 may be different from the cell height CH2 of the standard cells SC2 located in other rows R1 and R4.

In some example embodiments, the standard cells SC1 and SC1' arranged in the second and third rows R2 and R3, respectively, have the same first cell height CH1, and the standard cells SC2 and SC2' arranged in the first and fourth rows R1 and R4, respectively, may have the same second cell height CH2 that is less than the first cell height CH1. On the other hand, the plurality of standard cells SC1, SC1', SC2 and SC2' may have different widths (defined as the first direction D1) even in the case in which the standard cells are located in the same row.

Most of the first and second standard cells SC1 and SC2 are arranged in one row, respectively, but some standard cells may be extended standard cells eSC1 and eSC2 arranged over two or more adjacent rows. The cell height of these extended standard cells eSC1 and eSC2 has the sum of heights of the two or more adjacent rows. For example, the first extended standard cells eSC1 are disposed over the second and third rows R2 and R3 having the same cell height, and may have a cell height equal to twice the first cell height CH1. The second extended standard cells eSC2 may be disposed over the third and fourth rows R3 and R4 having different cell heights, and may have a cell height corresponding to the sum of the first cell height CH1 and the second cell height CH2.

In some example embodiments, boundaries of the second and third rows R2 and R3 having the first cell height CH1 are arranged adjacent to each other in the column direction, for example, the second direction D2, and the first and fourth rows R1 and R4 having the second cell height CH2 may be disposed to be adjacent to different boundaries of the second and third rows, respectively. In some example embodiments, a case in which two cell heights are illustrated, but rows having three or more different cell heights may be configured, and the arrangement thereof may be variously modified. For example, the second and third rows R2 and R3 having a first cell height CH1 and the first and fourth rows R1 and R4 having a second cell height CH2 may be alternately disposed in the second direction D.

Each of the plurality of standard cells SC1 and SC2 may include complementary metal-oxide semiconductor transistors, e.g. transistors of both p-type and n-type. Each of the plurality of standard cells SC1 and SC2 may have a first conductivity-type (e.g., p-type) device area and a second conductivity-type (e.g., n-type) device area arranged in the column direction, for example, the second direction D2. Standard cells located in adjacent two rows among the first to fourth rows R1, R2, R3, and R4 may be arranged such that the same conductivity-type device areas are adjacent to each other. For example, the standard cells SC1 and SC1' of the second and third rows R2 and R3 are arranged so that the p-type device areas are adjacent to each other, and the standard cells SC2 and SC1 of the first and second rows R1 and R2 and the standard cells SC1' and SC2' of the third and fourth rows R3 and R4 may be arranged such that n-type device areas are adjacent to each other.

A plurality of first and second power lines PM1 and PM2 supplying power to the plurality of standard cells SC1 and SC2 may respectively extend in one direction D1 along boundaries CB of the plurality of standard cells SC1 and SC2. The plurality of first and second power lines PM1 and PM2 may supply different potentials to the standard cells SC1 and SC2 positioned therebetween, respectively. Among the plurality of first and second power lines PM1 and PM2, a power line disposed at the boundary between the standard cells SC1 and SC2 of two adjacent rows may be a shaped power line shared by adjacent standard cells SC1 and SC2.

As illustrated in FIG. 3, the plurality of first power lines PM1 may be disposed at an outer boundary adjacent to the p-type device region (e.g., an upper boundary of the first row R1, a lower boundary of the fourth row R3), and at a boundary between adjacent p-type device regions (e.g., between the second row R2 and the third row R3); and the plurality of second power wires PM2 may be arranged at an outer boundary adjacent to the n-type device region and at boundaries between adjacent n-type device regions (e.g., at boundaries between the first row R1 and the second row R2 and at boundaries between the third row R3 and the fourth row R4). The first power lines PM1 and the second power lines PM2 may be alternately arranged in a column direction, for example, a second direction D2. The plurality of first power lines PM1 may correspond to Vdd power lines, and the plurality of second power lines PM2 may correspond to GND power lines; however, example embodiments are not limited thereto.

Figure 4A:
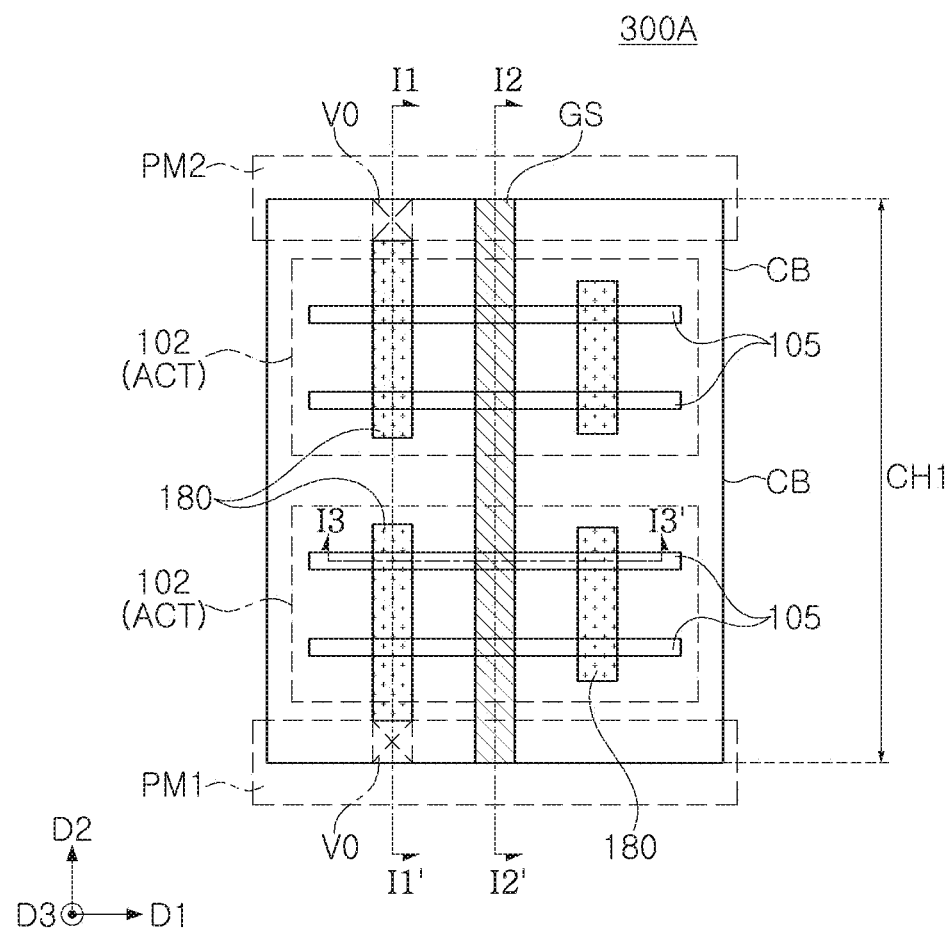
FIGS. 4A and 4B are plan views illustrating a semiconductor device (standard cell) according to some example embodiments.
Figure 4B:
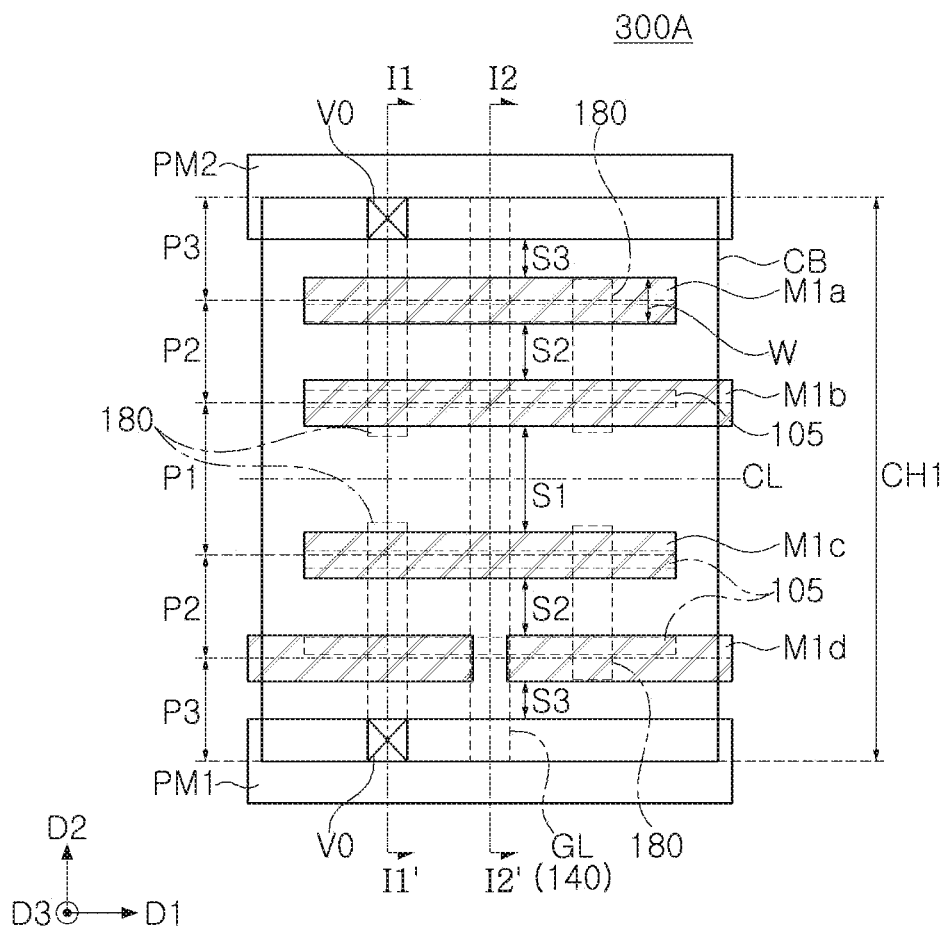

FIGS. 4A and 4B are plan views illustrating a semiconductor device according to some example embodiments, respectively, and illustrate a structure and wiring of a semiconductor device 300A corresponding to one standard cell, respectively.

The semiconductor device 300A illustrated in FIG. 4A may be understood as a "logic cell" corresponding to one "standard cell" indicated by "A" in the layout illustrated in FIG. 3.

Referring to FIG. 4A, the semiconductor device 300A according to some example embodiments may be a complementary metal oxide semiconductor (CMOS) device disposed between the first power line PM1 that supplies a first potential and the second power line PM2 that supplies a second potential. The semiconductor device 300A has two active regions ACT of different conductivity-types. For example, the two active regions ACT may have a p-type active region having an n-type well and/or an n-type region having a p-well PW.

Figure 5A:
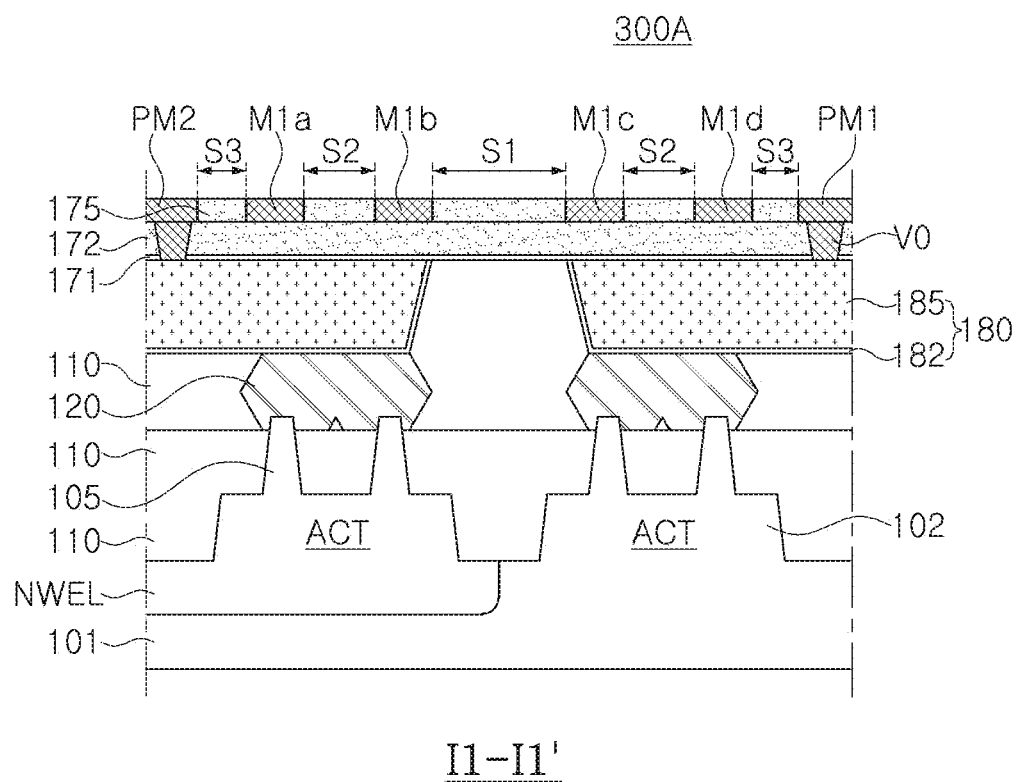
FIGS. 5A to 5C are cross-sectional views of the semiconductor device of FIGS. 4A and 4B, taken along lines I1-I1 , I2-I2', and I3-I3'.
Figure 5B:
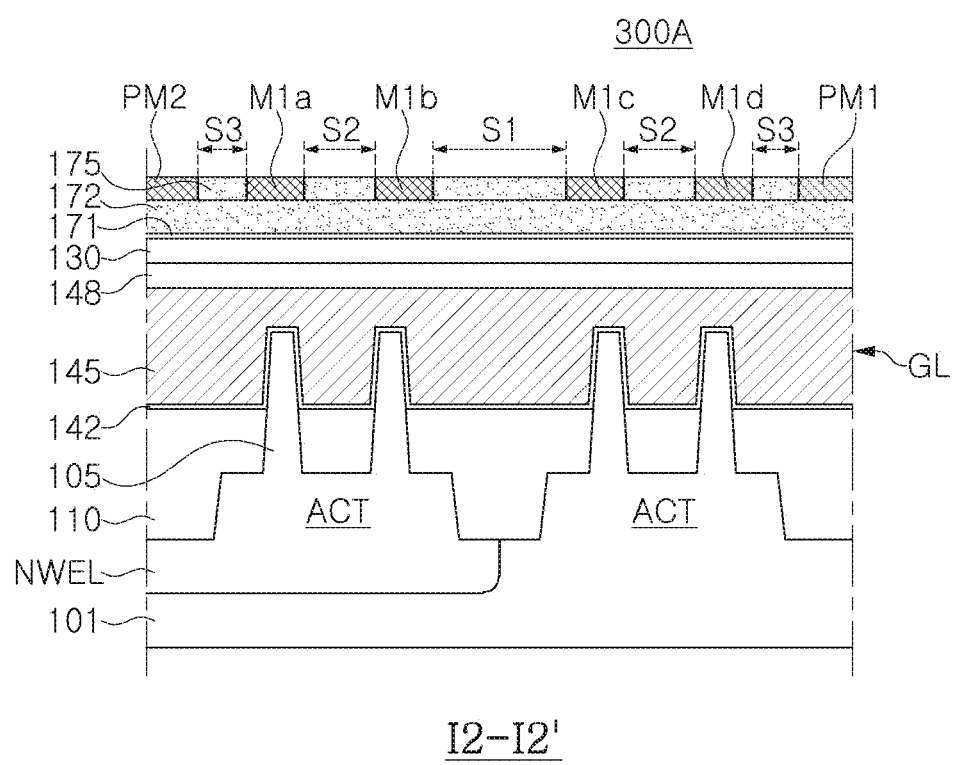
Figure 5C:
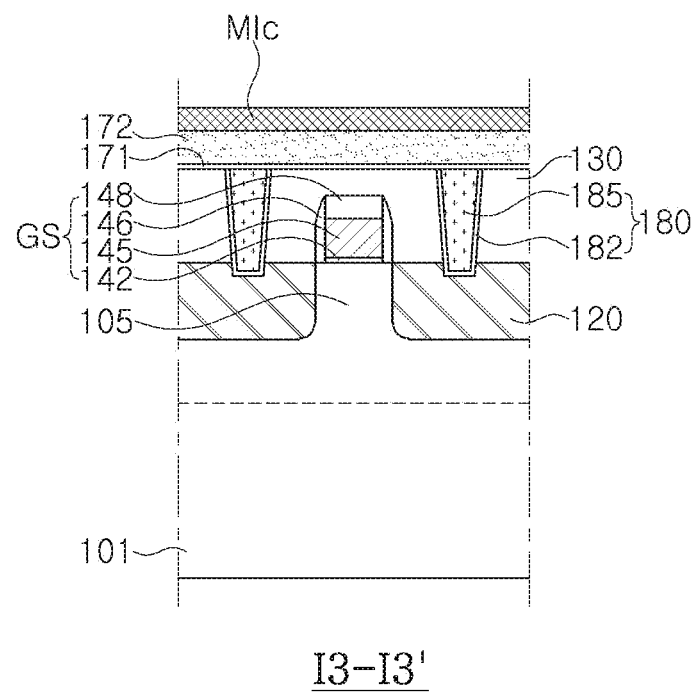

The semiconductor device 300A may have an active pattern 105 extending in a row direction, for example, the first direction D1. For example, the active pattern 105 may include an active fin protruding from the active region ACT in a third direction D3 perpendicular to the upper surface of the substrate, as illustrated in FIGS. 5A to 5C. For example, the active fins may constitute one or more fin field effect transistors (FinFETs).

In some example embodiments, two of the active patterns 105 extend in the first direction D1 as a row direction in each active region ACT, and may be disposed in parallel in the second direction D2 as a column direction. The semiconductor device 300A may include a gate structure GS extending in the column direction, for example, the second direction D2 and intersecting the active pattern 105.

Referring to FIG. 4B, the wiring structure according to some example embodiments includes four wiring lines M1a, M1b, M1c and M1d arranged at different spacings, between the first and second power lines PM1 and PM2. For example, among the four wiring lines M1a, M1b, M1c and M1d, a first spacing S1 between the neighboring second and third wiring lines M1b and M1c adjacent to the center may be greater than a second spacing S2 between other neighboring wiring lines. A third spacing S3 between the first and fourth wiring lines M1a and M1d and the first and second power lines PM2 and PM1, respectively, may be less than that of each of the first and second spacings S1 and S2. Alternatively or additionally, in the case of pitches, e.g. of center-line to center-line pitches P1, P2 and P3 of neighboring ones of the four wiring lines M1a, M1b, M1c and M1d, a first pitch P1 may be the greatest, and a third pitch P3 may be the smallest.

The wiring lines M1a, M1b, M1c and M1d employed in some example embodiments may have the same line width W, but the configuration is not limited thereto, and in some example embodiments, some of the wiring lines M1a, M1b, M1c and M1d may have different line widths.

In some example embodiments, the first to fourth wiring lines M1a, M1b, M1c and M1d may be symmetrically arranged vertically with respect to the center line CL in the first direction D1, but example embodiments are not limited. Alternatively or additionally, the first to fourth wiring lines M1a, M1b, M1c and M1d are disposed on the same level as the first and second power lines PM1 and PM2 as illustrated in FIGS. 5A to 5C. However, in some example embodiments, the wiring lines may be disposed on a level different from the power lines. For example, the wiring lines may be disposed on a level above, e.g. higher than or further away from the power lines in a direction perpendicular to a surface of the substrate 101, and a portion of the wiring lines may be connected to the power lines by conductive vias.

FIGS. 5A to 5C are cross-sectional views of the semiconductor device of FIGS. 4A and 4B taken along lines I1-I1', I2-I2', and I3-I3'.

Referring to FIGS. 5A to 5C, the semiconductor device 300A according to some example embodiments may include a substrate 101, the active regions 102 having the active fins 105, a device isolation layer 110, source/drain regions 120, gate structures 140 having a gate electrode 145, an interlayer insulating layer 130, a contact structure 180, first and second dielectric layers 172 and 175, a conductive via V0, and the wiring lines M1a, M1b, M1c and M1d. As described above, the wiring lines M1a, M1b, M1c and M1d may be arranged at different spacings S1, S2, and S3. The semiconductor device 300A may further include etch stop layers 160 disposed on the interlayer insulating layer 130. As described above, the semiconductor device 300A may include FinFET devices, e.g. transistors in which the active regions 102 include active fins 105 having a fin structure; however, example embodiments are not limited thereto.

The substrate 101 may have an upper surface extending in the first direction D1 and the second direction D2. The substrate 101 may be a wafer, e.g. a wafer of 200 mm, 300 mm, or 4500 mm; however, example embodiments are not limited thereto. Furthermore the substrate 100 may include a semiconductor material, for example, a group IV semiconductor, a group III-V compound semiconductor, and/or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, a silicon on sapphire (SOS) layer, or a semiconductor on insulator (SeOI) layer. The substrate 101 may include doped regions such as an N well region NWELL.

The device isolation layer 110 may define the active regions 102 in the substrate 101. The device isolation layer 110 may be formed by, for example, a shallow trench isolation (STI) process, e.g. a spin-on glass (SOG) deposition process. As illustrated in FIG. 5A, the device isolation layer 110 may include a region extending deeper into a lower portion of the substrate 101, between adjacent active regions 102, but the configuration is not limited thereto. In some example embodiments, the device isolation layer 110 may have a curved upper surface having a higher level toward the active fins 105. The device isolation layer 110 may be formed of an insulating material, and may include, for example, oxide, nitride, or a combination thereof.

The active regions 102 are defined by the device isolation layer 110 in the substrate 101 and may be disposed to extend in the first direction D1. The active fins 105 may have a shape protruding from the substrate 101 in the third direction D3. The upper ends of the active fins 105 may be disposed to protrude by a specific (or, alternatively, predetermined) height from the upper surface of the device isolation layer 110. The active fins 105 may be formed as part of the substrate 101 or may include a homogeneous or heterogeneous epitaxial layer grown from the substrate 101. The active fins 105 are partially recessed on both sides, e.g. on a first side and a second side, of the gate structures GS, and the source/drain regions 120 may be disposed on the recessed active fins 105. In some example embodiments, the active regions ACT may have doped regions including impurities. For example, the active fins 105 may include impurities diffused from, e.g. doped in and/or implanted in, the source/drain regions 120 in a region contacting the source/drain regions 120.

The source/drain regions 120 may be disposed on both sides of the gate structures GS and on regions in which the active fins 105 are recessed. In some example embodiments, the source/drain region 120 forms a recess in a partial region of the active fin 105, and may have an upper surface on a level above, e.g. higher than or further away from, the upper surface of the active fin 105, by selectively epitaxial growth (SEG) performed on the recess. The source/drain regions 120 may be provided as source regions or drain regions of transistors. The upper surfaces of the source/drain regions 120 may be positioned on the same or similar height level as a lower surface of the gate structure GS in the cross-section illustrated in FIG. 5C. In some example embodiments, the relative heights of the source/drain regions 120 and the gate structure GS may be variously changed.

The source/drain regions 120 may have a merged shape connected to each other between the active fins 105 adjacent in the second direction D2, as illustrated in FIG. 5A, but the configuration is not limited thereto. The source/drain regions 120 may have angular sides in a cross-section according to FIG. 5A. However, in some example embodiments, the source/drain regions 120 may have various shapes, and for example, may have any one of a polygon, a circle, an oval, or a rectangle.

The source/drain regions 120 may be formed of an epitaxial layer, and may include, for example, silicon (Si), silicon germanium (SiGe), or silicon carbide (SiC). Also, the source/drain regions 120 may further include impurities such as at least one of boron (B), arsenic (As) or phosphorus (P). In some example embodiments, the source/drain regions 120 may include a plurality of regions including elements of different concentrations and/or doping elements.

The gate structure GS may extend in the second direction D2 by intersecting the active fins 105, on the active regions 102. Channel regions of transistors may be formed in the active fins 105 intersecting the gate structure GS. The gate structure GS may include a gate insulating layer 142, a gate electrode 145, gate spacer layers 146, and a gate capping layer 148.

The gate insulating layer 142 may be disposed between the active fin 105 and the gate electrode layer 165. In some example embodiments, the gate insulating layer 142 may be formed of a plurality of layers or may be disposed to extend on the side of the gate electrode 145. The gate insulating layer 142 may include at least one of oxide, nitride, or a high-k material. The high-k material may mean a dielectric material having a dielectric constant greater than that of a silicon oxide layer ($SiO_2$).

The gate electrode 145 may include a conductive material, and for example, may include at least one of a metal nitride such as a titanium nitride film (TiN), a tantalum nitride film (TaN), or a tungsten nitride film (WN), and/or a metal material such as aluminum (Al), tungsten (W), or molybdenum (Mo), or a semiconductor material such as doped polysilicon. The gate electrode 145 may be formed of two or more multiple layers. The gate electrode 145 may be disposed to be divided in the second direction D2, between at least some adjacent transistors, according to the circuit configuration of the semiconductor device 200. For example, the gate electrode 145 may be divided by a separate gate separation layer.

The gate spacer layers 146 may be disposed on both sides of, e.g. on a first side and a second side of, the gate electrode 145. The gate spacer layers 146 may insulate the source/drain regions 120 from the gate electrode 145. In some example embodiments, the gate spacer layers 146 may be formed of a multilayer structure. The gate spacer layers 146 may include at least one of an oxide, a nitride, and oxynitride, and in detail, may include a low dielectric. For example, the gate spacer layers 146 may include at least one of SiO, SiN, SiCN, SiOC, SiON, and SiOCN.

The gate capping layer 148 may be disposed on the gate electrode 145, and the lower surface and side surfaces thereof may be surrounded by the gate electrode 145 and the gate spacer layers 146, respectively. For example, the gate capping layer 148 may include at least one of an oxide, a nitride, and oxynitride.

The interlayer insulating layer 130 may be disposed to cover the source/drain regions 120 and the gate structure GS. The interlayer insulating layer 130 may include at least one of, for example, oxide, nitride, and oxynitride, and may include a low dielectric.

The contact structure 180 may penetrate through the interlayer insulating layer 130 and be connected to the source/drain regions 120 and/or penetrate through the interlayer insulating layer 130 and the gate capping layer 148 to be connected to the gate electrode 145. In addition, the contact structure 180 may apply electrical signal to the source/drain regions 120 and to the gate electrode 145. The contact structure 180 may be disposed to recess the source/drain regions 120 to a specific (or, alternatively, predetermined) depth, but the configuration is not limited thereto. The contact structure 180 may include a conductive barrier 182 and a contact plug 185. For example, the contact plug 185 may include a metal material such as at least one of tungsten (W), aluminum (Al), copper (Cu), and/or a semiconductor material such as doped polysilicon. In addition, in some example embodiments, the contact structure 180 may further include a metal-semiconductor layer such as a silicide layer disposed at an interface in contact with the source/drain regions 120 and the gate electrode 145.

The first and second low dielectric layers 172 and 175 cover the contact structures 180 and are disposed on the same level as the wiring structure including the conductive via V0 and the wiring lines M1a, M1b, M1c and M1d. For example, the first and second low dielectric layers 172 and 175 may include at least one of SiO, SiN, SiCN, SiOC, SiON, and SiOCN. Each of the wiring structures may include at least one of aluminum (Al), copper (Cu), and tungsten (W). In some example embodiments, in the wiring structure, an additional dielectric layer is formed and additional wiring lines may be disposed on an upper level thereof.

In some example embodiments, when forming an active pattern such as an active fin, a dummy pattern such as a dummy fin having an externally identical structure to the active pattern but not functioning as a part of a semiconductor device may be formed together. Such dummy patterns may be disposed between standard cells in a row direction (e.g., the first direction D1).

Figure 6:
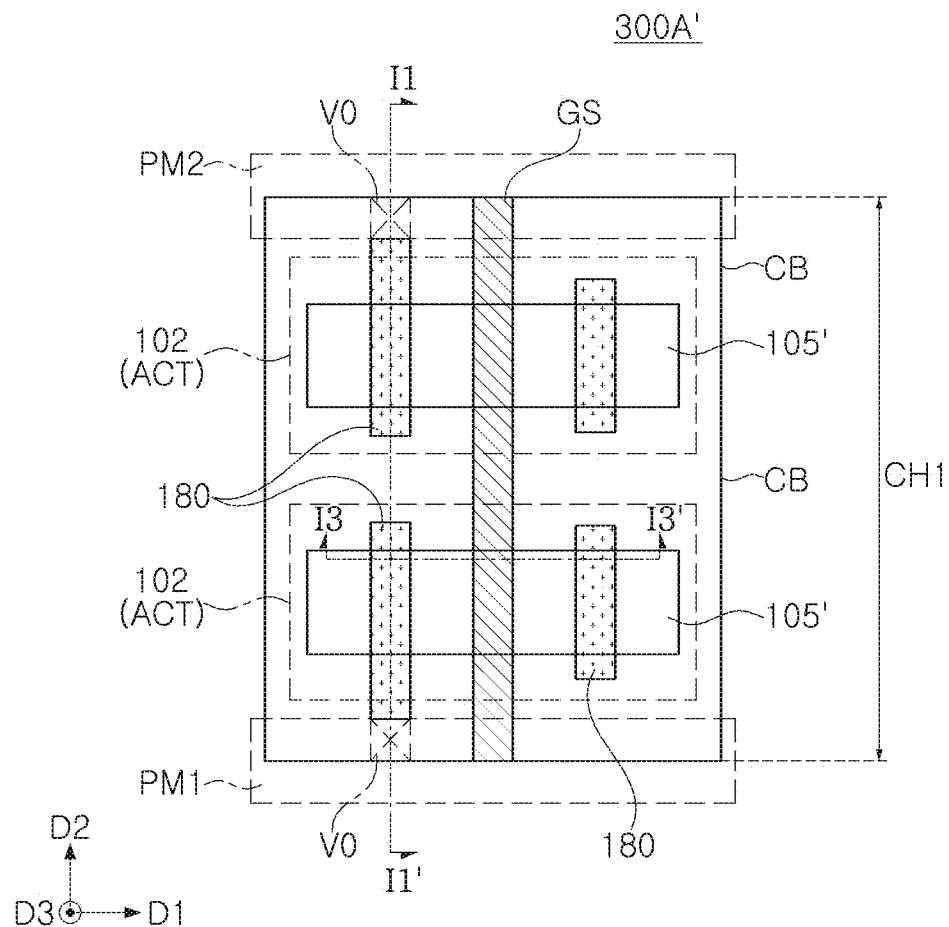
FIG. 6 is a plan view illustrating a semiconductor device (standard cell) according to some example embodiments.

The semiconductor device according to some example embodiments may correspond to transistors having various structures. As an example, the semiconductor device illustrated in FIGS. 6 and 7A and 7B has a transistor (i.e., MBCFET®) structure with nanosheets. FIG. 6 is a plan view illustrating a semiconductor device (standard cell) according to some example embodiments, and FIGS. 7A and 7C are cross-sectional views of the semiconductor device of FIG. 6 taken along lines I1-I1' and I3-I3'.

Figure 7A:
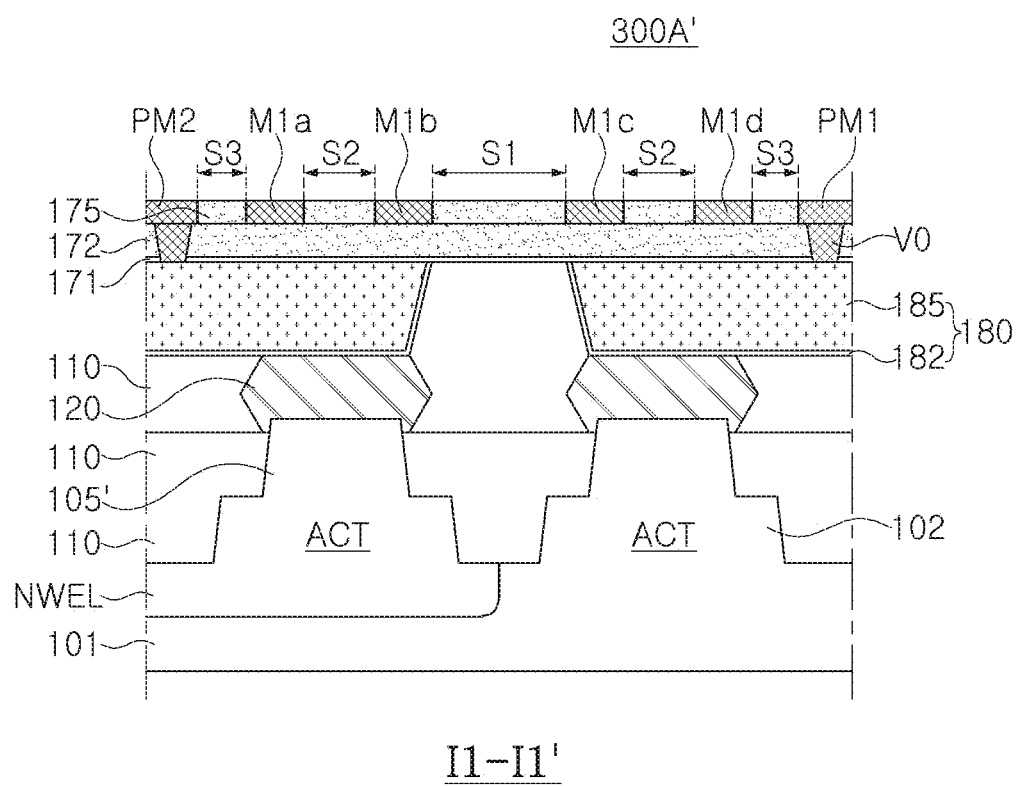
FIGS. 7A and 7B are cross-sectional views of the semiconductor device of FIG. 6, taken along lines I1-I1' and I3-I3'.
Figure 7B:
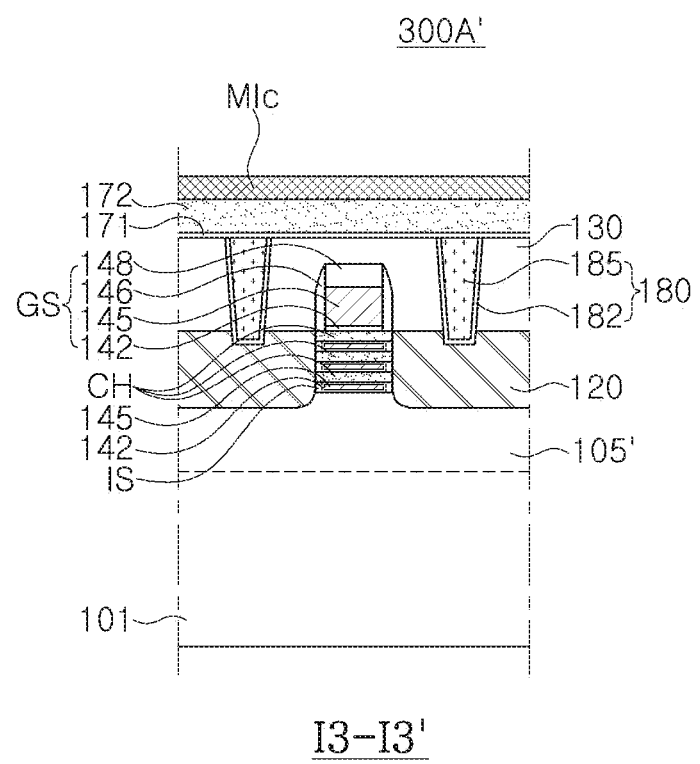

Referring to FIGS. 6, 7A and 7B, a semiconductor device 300A' according to some example embodiments may be understood as being similar to the semiconductor device 300A illustrated in FIGS. 4A and 4B and FIGS. 5A to 5C, except that the active structure for a transistor is configured to include a plurality of nanosheets, while having a single structure of an active pattern in respective transistor regions. In addition, the components of some example embodiments may be understood with reference to the description of the same or similar components of the semiconductor device 300A illustrated in FIGS. 4A and 4B and FIGS. 5A to 5C unless otherwise stated otherwise.

Referring to FIG. 6, in the semiconductor device 300A' according to some example embodiments, one fin-type active pattern 105' may be disposed in each active region 102 of each transistor. Similar to the active fin 105 illustrated in FIGS. 4A and 5A, the active pattern 105' protrudes from the upper surface of the active region 102 in a third direction D3, and may have a structure extending in the first direction D1.

Referring to FIGS. 7A and 7B, the semiconductor device 300A' may further include a plurality of nano-sheet-shaped channel layers CH vertically spaced apart from each other on the active pattern 105', and internal spacer layers IS disposed between the plurality of channel layers CH to be parallel with the gate electrode layer 145. The semiconductor device 300A' may include transistors of a gate-all-around (GAA) type structure in which the gate electrode 145 is disposed between the active pattern 105' and the channel layers CH and between the plurality of channel layers CH. For example, the semiconductor device 300A' may include transistors formed by the channel layers CH, the source/drain regions 120, and the gate electrode 145.

The plurality of channel layers CH may be disposed in a plurality of two or more channel layers spaced apart from each other in the third direction D3, on the active pattern 105'. The channel layers CH may be connected to the source/drain regions 120, while may be spaced apart from upper surfaces of the active pattern 105'. The channel layers 120 may have the same or similar width as the active pattern 105' in the second direction D2, and may have the same or similar width as the gate structure GS in the first direction D1. However, as in some example embodiments, when the internal spacer IS is employed, the channel layers CH may have a width smaller than the width of the side surfaces under the gate structure GS.

The plurality of channel layers CH5 may be formed of a semiconductor material, and may include at least one of silicon (Si), silicon germanium (SiGe), and germanium (Ge). The channel layers CH may be formed of, for example, the same material as the substrate 101 (in detail, the active region). The number and shape of the channel layers CH constituting one channel structure may be variously changed in embodiments. For example, in some example embodiments, a channel layer may be further positioned in a region in which the active pattern 105' contacts the gate electrode layer 145.

The gate structure GS may be disposed on the active pattern 105' and the plurality of channel layers CH, to extend to intersect the active pattern 105 and the plurality of channel layers CH. Channel regions of transistors may be formed in the plurality of channel layers CH and the active pattern 105' intersecting the gate structure GS. In some example embodiments, the gate insulating layer 142 may be disposed not only between the active pattern 105' and the gate electrode 145, but also between the plurality of channel layers CH and the gate electrode 145. The gate electrode 145 may be disposed on the active pattern 105' to fill between the plurality of channel layers CH and extend onto the plurality of channel layers CH. The gate electrode 145 may be spaced apart from the plurality of channel layers CH by the gate insulating layer 142.

The internal spacers IS may be disposed between the plurality of channel layers CH, to be in parallel with the gate electrode layer 145. The gate electrode 145 may be separated from the source/drain regions 120 by internal spacers IS, to be electrically separated. The inner spacers IS may have a flat side surface facing the gate electrode 145 or, alternatively, have a shape that is convexly rounded inwardly toward the gate electrode 145. The internal spacers IS may be formed of at least one of an oxide, a nitride, and a oxynitride, and in detail, may be formed of a low-k film.

As described above, the semiconductor device according to some example embodiment may be applied to a transistor having various structures, and in addition to the above-described example embodiments, may be implemented as a semiconductor device including a vertical FET (VFET) having an active region extending perpendicular to the upper surface of the substrate 101 and a gate structure surrounding the same, or a semiconductor device including a negative capacitance FET (NCFET) using a gate insulating film having ferroelectric properties.

Figure 8:
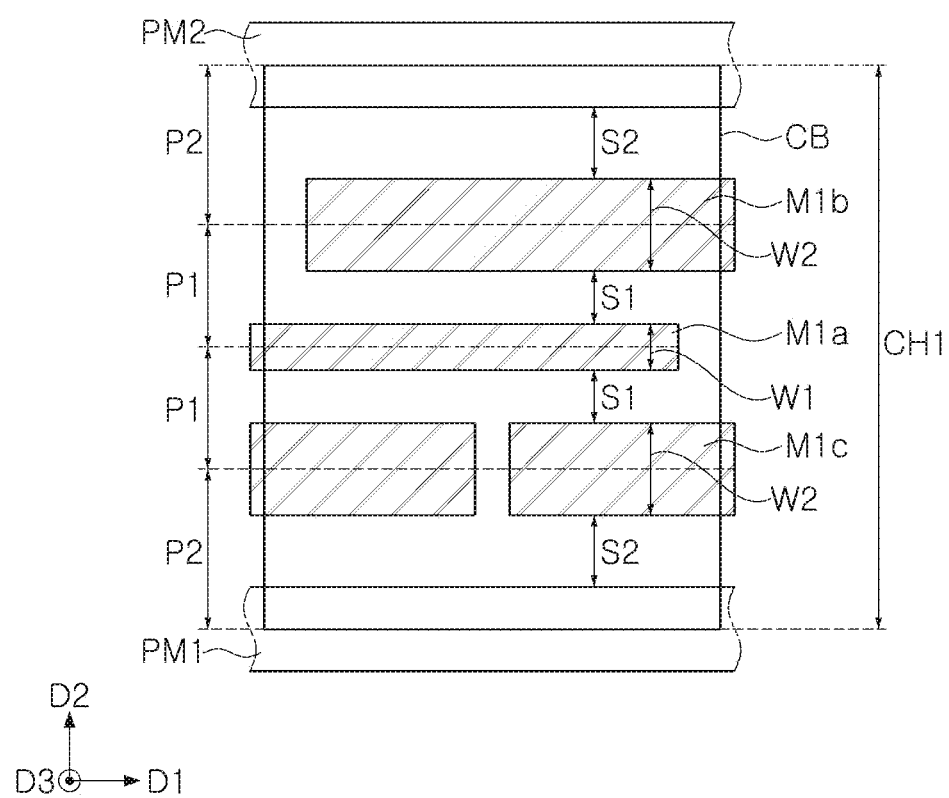
FIGS. 8 and 9 are plan views illustrating semiconductor devices according to various example embodiments.
Figure 9:
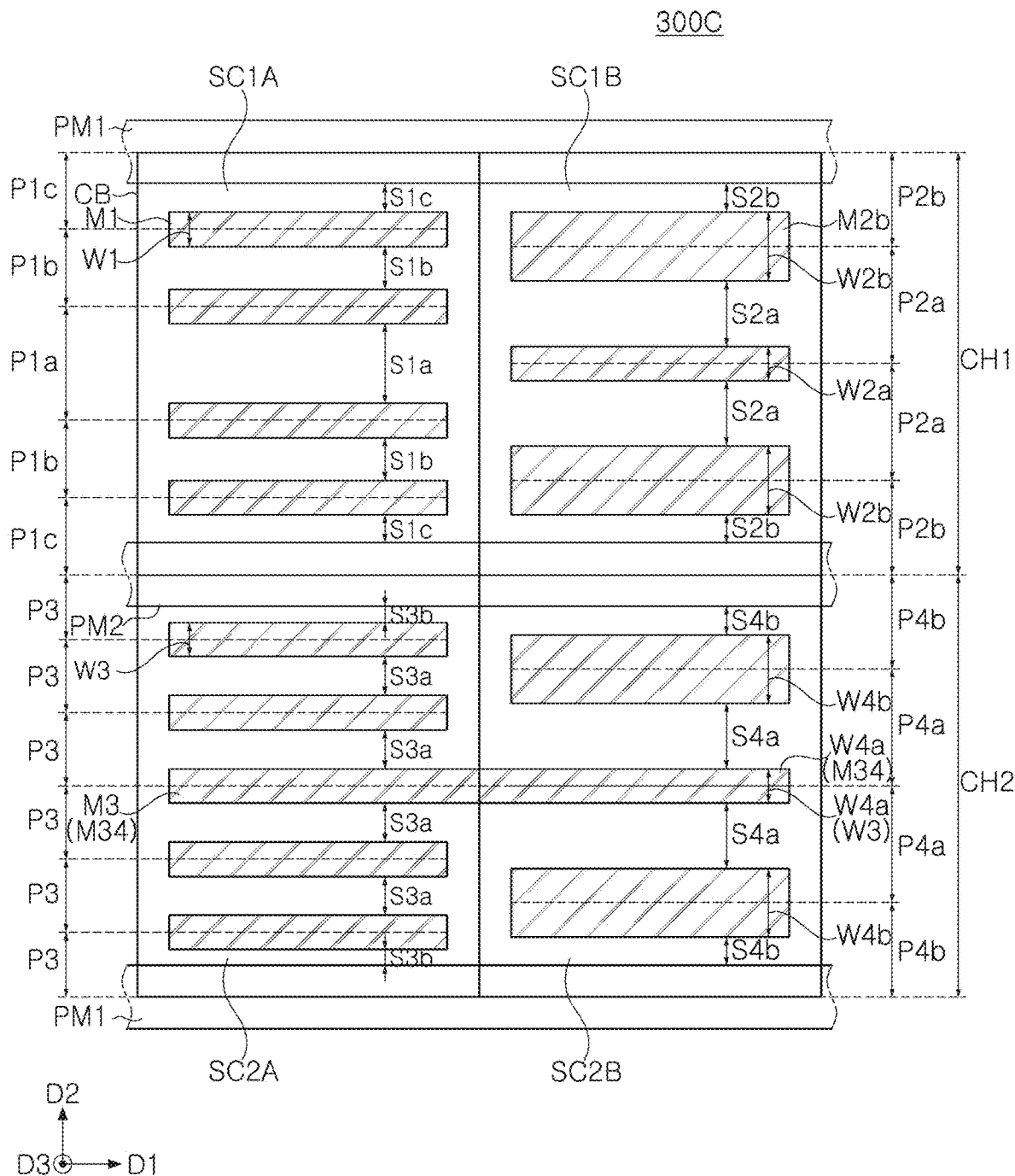

The wiring lines according to some example embodiments are illustrated in a form in which wiring lines having the same line width are arranged at different spacings in a vertical symmetrical manner, but in other embodiments, the wiring lines may be arranged in various different shapes. FIGS. 8 and 9 are plan views illustrating semiconductor devices according to various example embodiments.

Referring to FIG. 8, a semiconductor device 300B according to some example embodiments may be understood as being similar to the semiconductor device 300A illustrated in FIGS. 4A and 4B and FIGS. 5A to 5C, except that the arrangement of wiring lines M1a M1b, and M1c is different. In addition, the components of various example embodiments may be understood with reference to the description of the same or similar components of the semiconductor device 300A illustrated in FIGS. 4A and 4B and FIGS. 5A to 5C unless otherwise stated otherwise.

The semiconductor device 300B according to some example embodiments may include first to third wiring lines M1a M1b, and M1c, which are arranged symmetrically in a vertical direction, similar to some example embodiments, but have different widths W1 and W2. Alternatively or additionally, the first to third wiring lines M1a, M1b, and M1c and the first and second power lines PM1 and PM2 may be arranged at different pitches P1 and P2. In detail, the first wiring line M1a and the second and third wiring lines M1b and M1c are arranged at the same first spacing S1 (and the same first pitch P1), and the second and third wiring lines M1b and M1c and the first and second power lines PM1 and PM2 may be arranged at a second spacing S2 smaller than the first spacing S1 (and at a second pitch P2).

Referring to FIG. 9, a semiconductor device 300C according to some example embodiments may include first to fourth standard cells SC1A, SC1B, SC2A and SC2B arranged in two rows and two columns, while having different cell heights CH1 and CH2.) The semiconductor device 300C may also be understood as logic cells of a semiconductor device, corresponding to four standard cells indicated by "B" in the layout 300 illustrated in FIG. 3.

The first and second standard cells SC1A and SC1B have the same first cell height CH1 and are arranged in a first row, and the third and fourth standard cells SC2A and SC2B have the same second cell height CH2 and may be arranged in the second row.

Similar to other example embodiments, wiring lines of the first to fourth standard cells SC1A, SC1B, SC2A and SC2B may be arranged (including the arrangement with first and second power lines PM1 and PM2), in such a manner that at least one of a pitch, a spacing, and a line width thereof is different from the others, and the first to fourth standard cells SC1A, SC1B, SC2A and SC2B may respectively have various arrangements. Furthermore, standard cells located in the same row may include wiring lines having the arrangement in which at least one of pitch, spacing and line width thereof is different from the others.

In the first row, the wiring lines M1 of the first standard cell SC1A have the same line width W1, but may be arranged at different spacings S1a, S1b and S1c and different pitches P1a, P1b and P1c. The second standard cell SC1B has a wiring line M2a having a first width W2a on a center line, and two wiring lines M2b having a second width W2b on both sides thereof. The wiring lines M2a and M2b of the second standard cell SC1B may also be arranged at different spacings S2a and S2b and at different pitches P2a and P2b.

In the second row, the wiring lines M3 of the third standard cell SC2A also have the same line width W3, and the wiring lines M3 are arranged at the same spacing S3a, but a spacing S3b thereof with the power line PM1 and PM2 may be less than a spacing S3a of the wiring lines M3, and the wiring lines M3 of the third standard cell SC2A and the power lines PM1 and PM2 may be arranged at the same pitch P3. Similar to the second standard cell SC1B, the fourth standard cell SC2B includes a wiring line M4a having a first width W4a, and two wiring lines M4b having a second width W4b on both sides thereof. The wiring lines M4a and M4b may also be arranged at different spacings S4a and S4b and/or at different pitches P4a and P4b.

On the other hand, some wiring lines may extend over adjacent standard cells to be provided as signal lines shared by two or more standard cells. As illustrated in FIG. 9, some wiring lines M34 may extend in the first direction D1 over the third and fourth standard cells SC2A and SC2B, to be shared by the third and fourth standard cells SC2A and SC2B.

The standard cells located in the same row may have a different number of wiring lines. As illustrated in FIG. 9, the first standard cell SC1A may include four wiring lines M1, and the second standard cell SCA2 may include three wiring lines M2a and M2b. Similarly, the third standard cell SC2A may include five wiring lines M3, and the fourth standard cell SC2B may include three wiring lines M4a and M4b.

In some example embodiments, the number of wiring lines of a standard cell may be changed depending on cell heights. For example, the first standard cell SC1A having a first cell height CH1 may have four wiring lines M1, and the third standard cell SC2A having a second cell height CH2 greater than the first cell height CH1 may have five wiring lines M3.

Figure 10A:
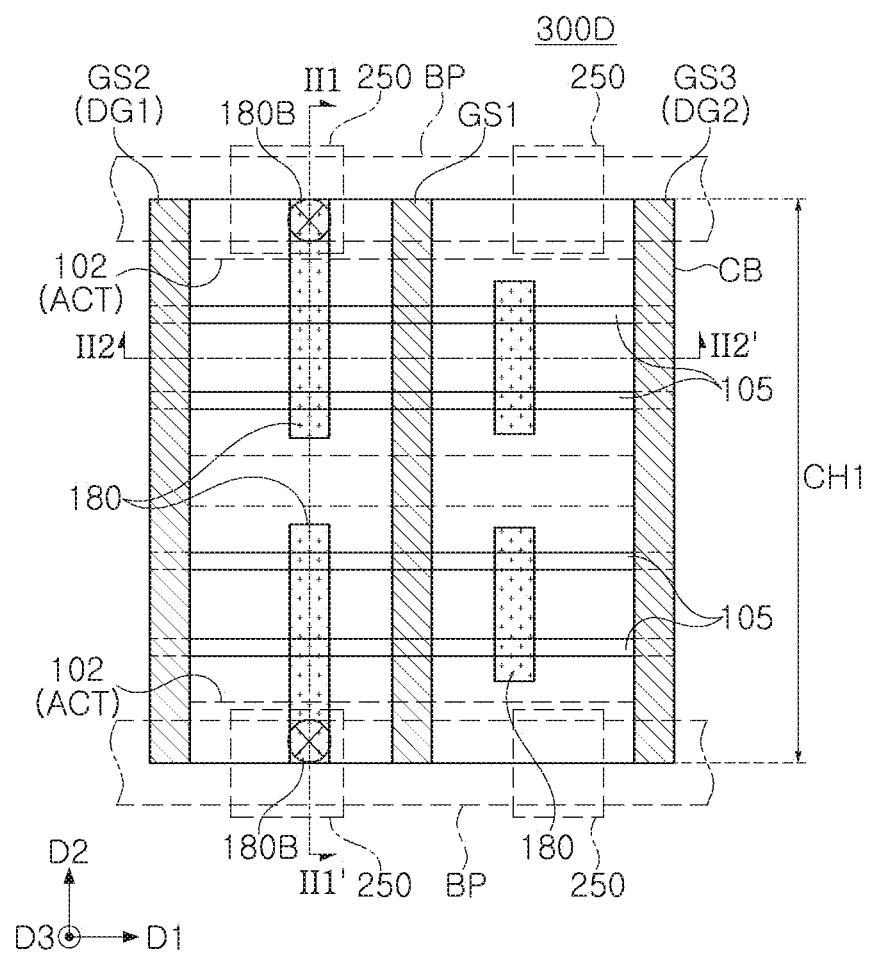
FIGS. 10A and 10B are plan views illustrating a semiconductor device according to some example embodiments.
Figure 10B:
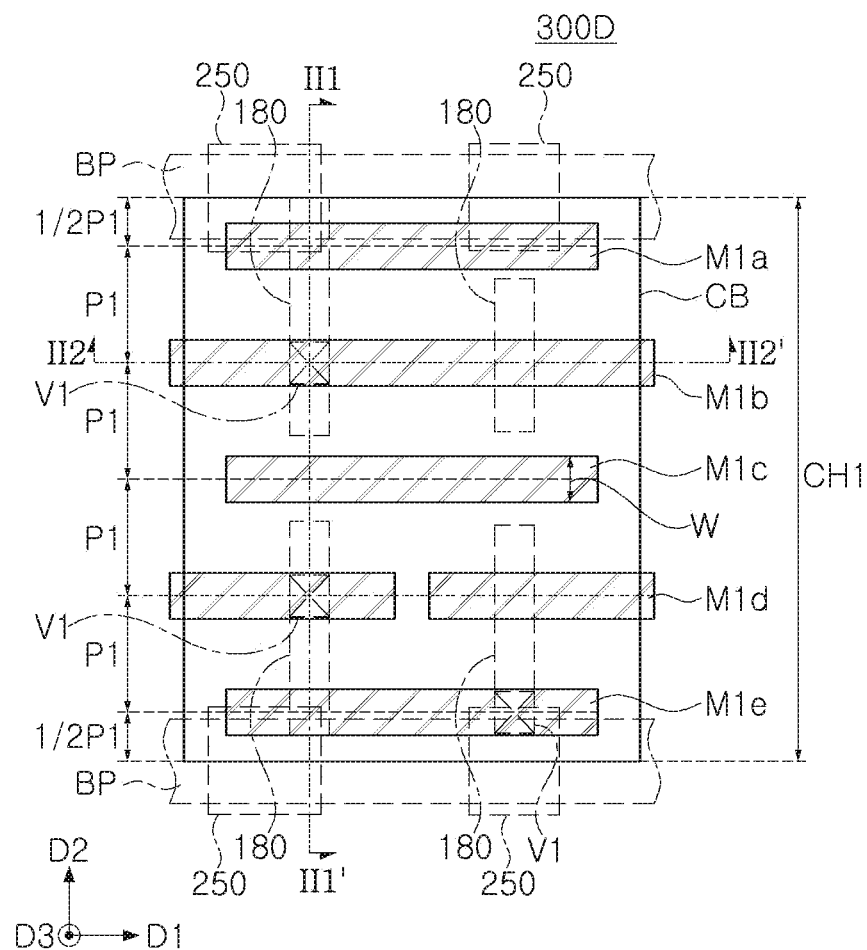

FIGS. 10A and 10B are plan views illustrating a semiconductor device according to some example embodiments.

Referring to FIGS. 10A and 10B, a semiconductor device 300D according to some example embodiments may be understood as being similar to the semiconductor device 300A illustrated in FIGS. 4A and 4B and FIGS. 5A to 5C, except that the power line is implemented as a buried power line (BP), the arrangement of wiring lines M1a, M1b, M1c, M1d and M1e is different, and dummy gate structures DG1 and DG2 are provided. In addition, the components of these example embodiments may be understood with reference to the description of the same or similar components of the semiconductor device 300A illustrated in FIGS. 4A and 4B and FIGS. 5A to 5C unless otherwise specified.

Referring to FIG. 10A, the semiconductor device 300D according to some example embodiments includes the buried power line BP extending along the cell boundary CB in the first direction D1. While the power lines employed in the previous embodiment are disposed on a level above, e.g. higher than or further away from, the upper surface of the contact structure 180, the buried power line BP employed in this embodiment may have a buried structure to be located on a level lower than a contact structure 180. For example, the buried power line BP may be buried in the active region 102 and/or the device isolation layer. Since the buried power line BP is not located in the BEOL structure like the wiring lines M1a, M1b, M1c, M1d and Mie, the wiring lines located at the same level may be designed more freely, and a standard cell having the same number of tracks (a number of wiring lines or the like) may be implemented to have a relatively smaller cell height, or a relatively larger number of tracks may be guaranteed in a standard cell having the same cell height.

The buried power line BP employed in some example embodiments may be connected to a power circuit wiring (ML2 in FIG. 11) located on a lower surface of the substrate (101 in FIG. 11) by a conductive structure 250 penetrating through the substrate. This connection structure will be described in more detail with reference to FIG. 11.

On the other hand, similar to other example embodiments, the semiconductor device 300D may include active regions having an active pattern 105 extending in the first direction D1. Two active patterns may be arranged in parallel in the second direction D2 which is a column direction, in each active region. The semiconductor device 300D may include a gate structure GS extending in a column direction, for example, in a second direction D2 and intersecting the active pattern 105.

Referring to FIG. 10B, the wiring structure employed in this embodiment may include five wiring lines M1a, M1b, M1c, M1d and M1e arranged at different spacings between the first and second power lines PM1 and PM2. The wiring lines M1a, M1b, M1c, M1d and M1e may also be arranged on a region where the conventional power line is disposed, and thus, may have a number of wiring lines greater than the number of wiring lines of the standard cell 300A having the same cell height CH1. The wiring lines M1a, M1b, M1c, M1d and M1e are arranged at a constant pitch P1, and the wiring lines M1a and M1e located on an outer side may have a distance equal to half (½P1) of the pitch with the cell boundary CB. In some example embodiments, wiring lines of other standard cells adjacent in the second direction D2 are also disposed at a half pitch (½P1) with the cell boundary CB, and thus, the wiring lines between the two standard cells may be arranged at the same pitch P1.

A plurality of gate structures GS1, GS2 and GS3 may extend in the second direction D2 and may be disposed to be spaced apart from each other in the first direction D1. Some gate structures may be provided as dummy gate structures. For example, the second and third gate structures GS2 and GS3 positioned at the cell boundary CB may include dummy gate structures DG1 and DG2 that do not substantially perform an electrical function unlike the actual first gate structure GS1 constituting/corresponding to the transistor.

Figure 11:
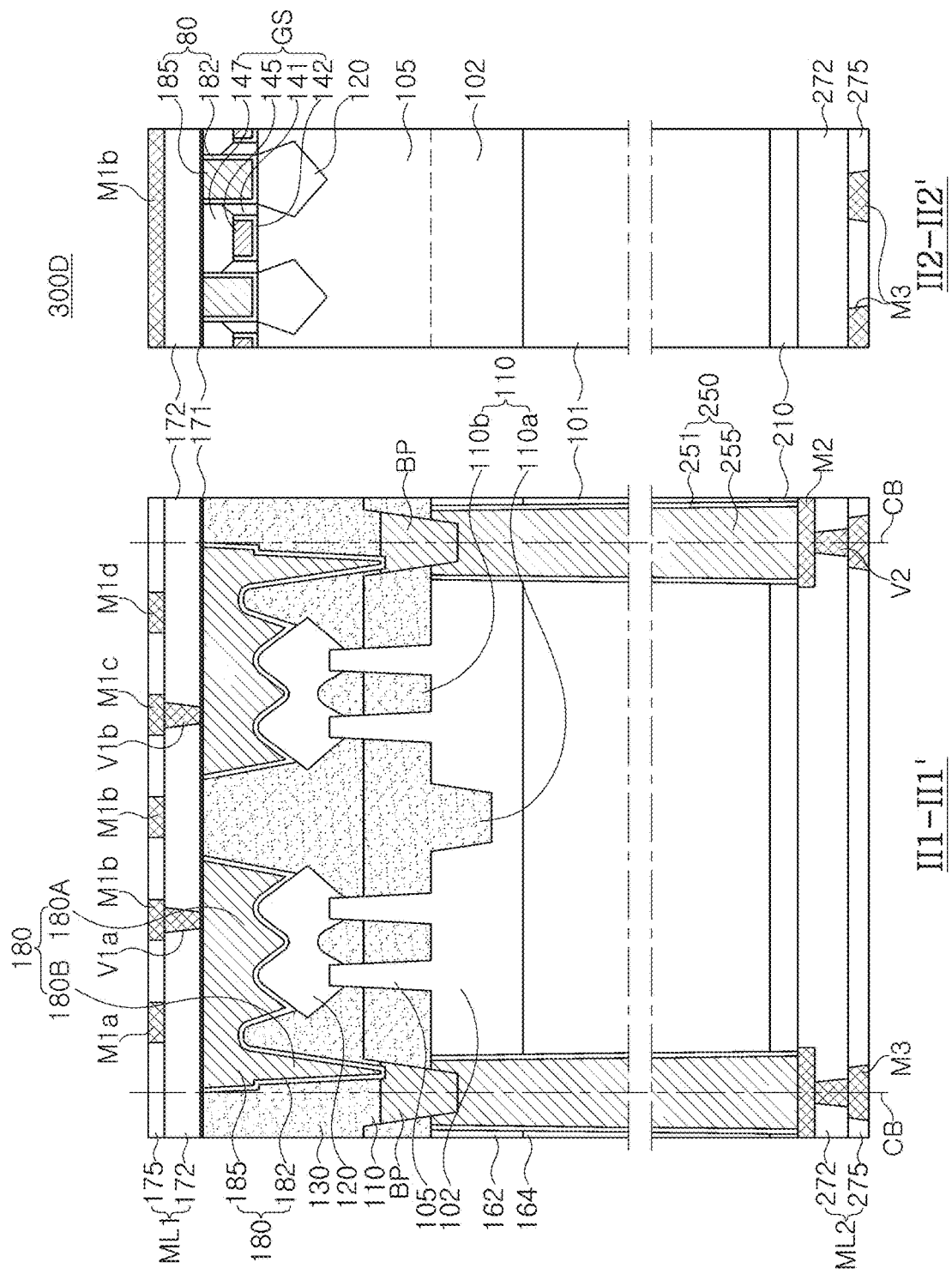
FIG. 11 is a cross-sectional view of the semiconductor device of FIGS. 10A and 10B, taken along lines III-II1' and II2-II2'.
Figure 12:
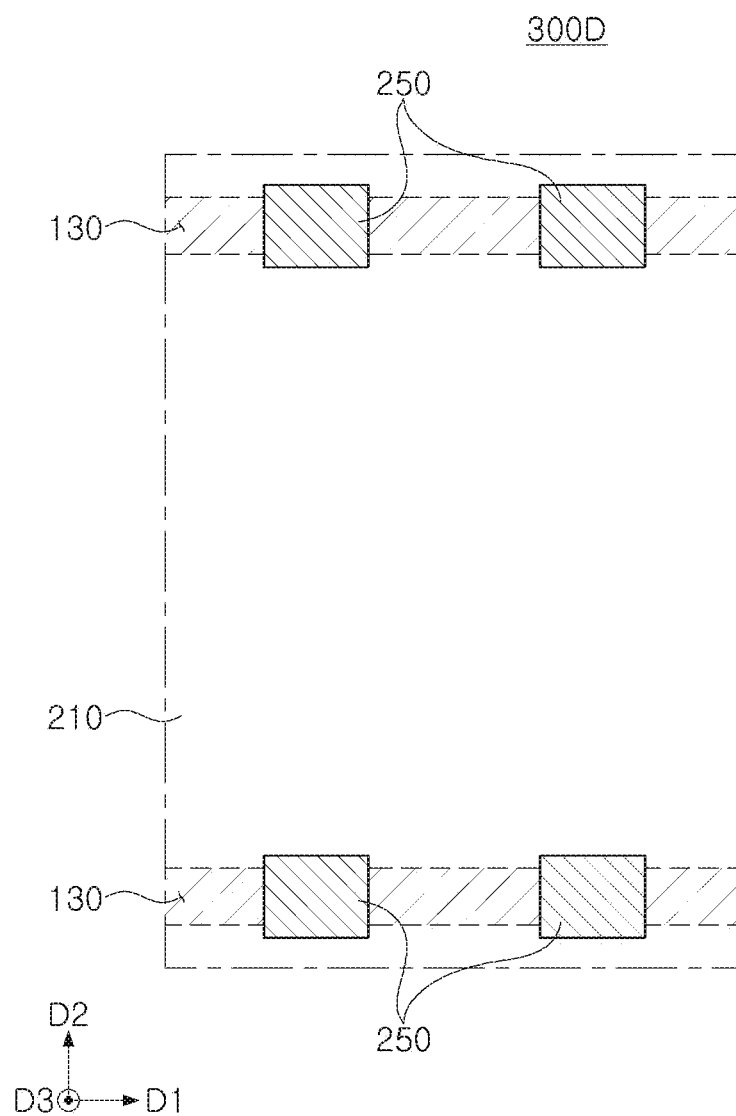
FIG. 12 is a bottom view illustrating the semiconductor device of FIGS. 10A and 10B.

FIG. 11 is a cross-sectional view of the semiconductor device of FIGS. 10A and 10B taken along lines III1-III1' and II2-II2', and FIG. 12 is a bottom view illustrating the semiconductor device of FIGS. 10A and 10B.

Referring to FIG. 11 along with FIGS. 10A and 10B, the semiconductor device 300D according to some example embodiments may include a substrate 101 having an active region 102. A plurality of active fins 105 may be disposed in the active region 102.

Similar to the other example embodiments, each of the plurality of active fins 105 has a structure protruding from an upper surface of the active region 102 in a third direction D3. The plurality of active fins 105 may be arranged in parallel on the upper surface of the active region 102 and may extend in the first direction D1. The active fins 105 may serve as active regions of each transistor. In some example embodiments, the active fins 105 are illustrated in a form in which two are provided as the source/drain regions 120, but the configuration is not limited thereto. In other example embodiments, the active fin may be provided in a single number or three or more (see FIG. 13).

The source/drain regions 120 may be formed in partial regions of the active fins 105 located on both sides of the gate structure GS, respectively. In some example embodiments, the source/drain region 120 may be formed by forming a recess in a partial region of the active fin 105 and selectively epitaxially growing in the recess, to have an upper surface of a higher level than the upper surface of the active fin 105.

The semiconductor device 300D according to some example embodiments may include a gate structure GS. Referring to FIGS. 10A and 12, the gate structure GS may have a line structure extending in the second direction D2. The gate structure GS may overlap a region of the active fins 105.

Similar to other example embodiments, the gate structure GS employed in this embodiment includes the gate spacers 141, the gate dielectric layer 142 and the gate electrode 145 sequentially disposed between the gate spacers 141, and a gate capping layer 147 disposed on the gate electrode 145.

The semiconductor device 300D may include an element isolation layer 110. The device isolation layer 162 may include a first isolation region 110a defining an active region 102 and a second isolation region 110b adjacent to the first isolation region 110a and defining a plurality of active fins 105. The first separation area 110a has a deeper bottom surface than the second separation area 110b. The first isolation region 110a may be referred to as a deep trench isolation (DTI) having a first depth, and the second isolation region 110b may be referred to as a shallow trench isolation (STI) having a second depth smaller than the first depth. The active fin 105 may penetrate through the second isolation region 110b, and a part thereof may protrude upwardly of the second isolation region 110b.

In some example embodiments, the buried power line BP may be disposed between a plurality of active fins 105 and may extend in the first direction D1 similar to the active fin 105. The buried power line BP employed in this embodiment may be buried from the second isolation region 110b to the active region 102. Alternatively or additionally, in other example embodiments, the buried area of the buried power line BP may be variously changed. In one example, the buried power line BP may be buried in the active region 110, and in another example, a part or a major part of the buried power line BP may be buried in the second isolation region 110b.

A conductive through-structure 250 may include a filled through-via 255 extending from a lower surface of the substrate 101 toward an upper surface, and an insulating liner 251 disposed between the through-via 255 and the substrate 101. For example, the conductive through-structure 250 may be through-silicon via (TSV). The conductive through-structure 250 may be formed from the rear surface of the substrate 101 to be connected to the buried power line BP.

The interlayer insulating layer 130 may be disposed on the device isolation layer 110 and may be provided to cover the source/drain regions 110 and the buried power line BP. The device isolation layer 110, in detail, the second isolation region 110b may include a portion covering the buried power line BP.

The buried power line BP may have an upper surface lower than the upper end of the active fin 105. The buried power line BP may not be exposed externally during the process of forming the source/drain 120. In addition, the buried power line BP may be above, e.g. higher than or further away from, the upper surface of the active region 102. The buried power line BP may be electrically connected to the contact structure 180. The contact structure 180 employed in this embodiment may connect the source/drain regions 110 and the buried power line BP together. For example, the contact structure 180 may include a conductive barrier 182 and a contact plug 185.

The contact structure 180 may be functionally divided into a first contact portion 180A connected to the source/drain region 120, and a second contact portion 180B connected to the first contact portion 180A and connected to the buried power line BP. The second contact portion 180B may extend deeper than the first contact portion 180A and may be electrically connected to the buried power line BP. As illustrated in FIG. 11, the second contact portion 180B extends deeper than the contact portion 180A within a cell boundary CB, for example, within one standard cell, and is electrically connected to the buried power line BP. Example embodiments are not limited thereto, and the second contact portion 180B connected to the buried power line BP may also be positioned on the cell boundary CB (see FIG. 14).

On the other hand, the contact structure 180 may be connected to a first wiring portion ML1 constituting a back end of lines (BEOL). The first wiring portion ML1 may be configured to interconnect a plurality of devices (e.g., transistors) implemented on the upper surface of the substrate 101, in detail, the active region 102. Similar to other example embodiments, the first wiring portion ML1 may include a plurality of low dielectric layers 172 and 175, first to fifth wiring lines M1a, M1b, M1c, M1d, Mle, and a conductive via V1. The second wiring line M1b and the fourth wiring line M1d may be connected to the contact structure 180 through conductive vias V1a and V1b, respectively. An etch stop layer 171 disposed between the interlayer insulating layer 130 and the first low dielectric layer 172 may be further included. The etch stop layer 171 may prevent, or reduce the likelihood of diffusion of metal (e.g., Cu) included in the metal wiring M1 and the metal via V1 into a lower region as well as an etch stop function. For example, the etch stop layer 171 may include aluminum nitride (AlN).

In some example embodiments, the contact structure 180 connected to a plurality of devices (e.g., source/drain regions 120, etc.) formed on the substrate 101 may be connected to the second wiring portion ML2 located on the rear surface of the substrate 101 through the buried power line BP and the conductive through-structure 250. The second wiring portion ML2 is a power supply line and signal supply lines implemented on the rear surface of the substrate 101, and may be understood as a wiring structure that replaces a part of a required BEOL. The second wiring portion ML2 provides a signal line and a power line for a plurality of devices (e.g., transistors) implemented on the upper surface of the substrate 101 through the buried power line BP and the conductive through-structure 250.

After the insulating layer 210 is formed on the rear surface of the substrate 101, the conductive through-structure 250 may be formed. The second wiring portion ML2 may be provided on the insulating layer 210. The second wiring portion ML2 may include a plurality of low dielectric layers 272 and 275, wiring lines M2 and M3, and a conductive via V2. The plurality of low dielectric layers may include first and second low dielectric layers 272 and 255 sequentially disposed on the insulating layer 210.

Referring to FIG. 12, a layout of a conductive through-structure 250 and a buried power line BP viewed from a lower surface of the substrate 101 is illustrated. The plurality of conductive through-structures 250 may be arranged to be connected to the buried power line BP extending in the first direction D1. FIG. 12 illustrates that the cross-section of the conductive through-structure 250 is substantially rectangular and illustrates a shape in which the length in the first direction D1 is greater than the length in the second direction, perpendicular thereto, but in another embodiment, the conductive through-structure 250 may have a variety of different shapes (e.g., circular or elliptical). On the other hand, in this embodiment, the conductive through-structures 250 may be arranged on the same line in the second direction (D2), but in other example embodiments, the conductive through-structures 250 may have a different arrangement. For example, the conductive through-structures 250 may be arranged to alternate with other conductive through-conductive structures 250 adjacent in the second direction D2.

Figure 13:
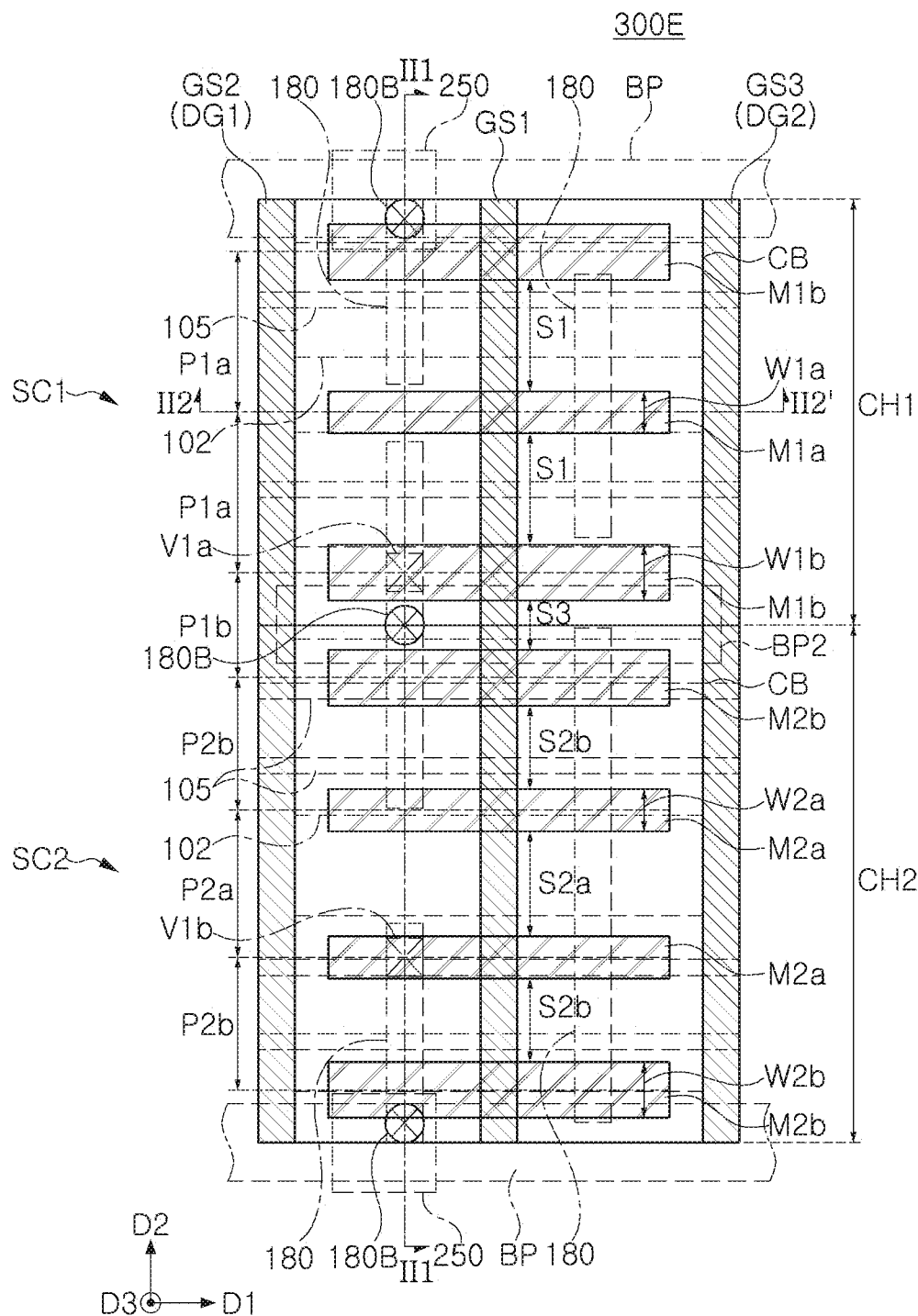
FIG. 13 is a plan view illustrating a semiconductor device according to some example embodiments.
Figure 14:
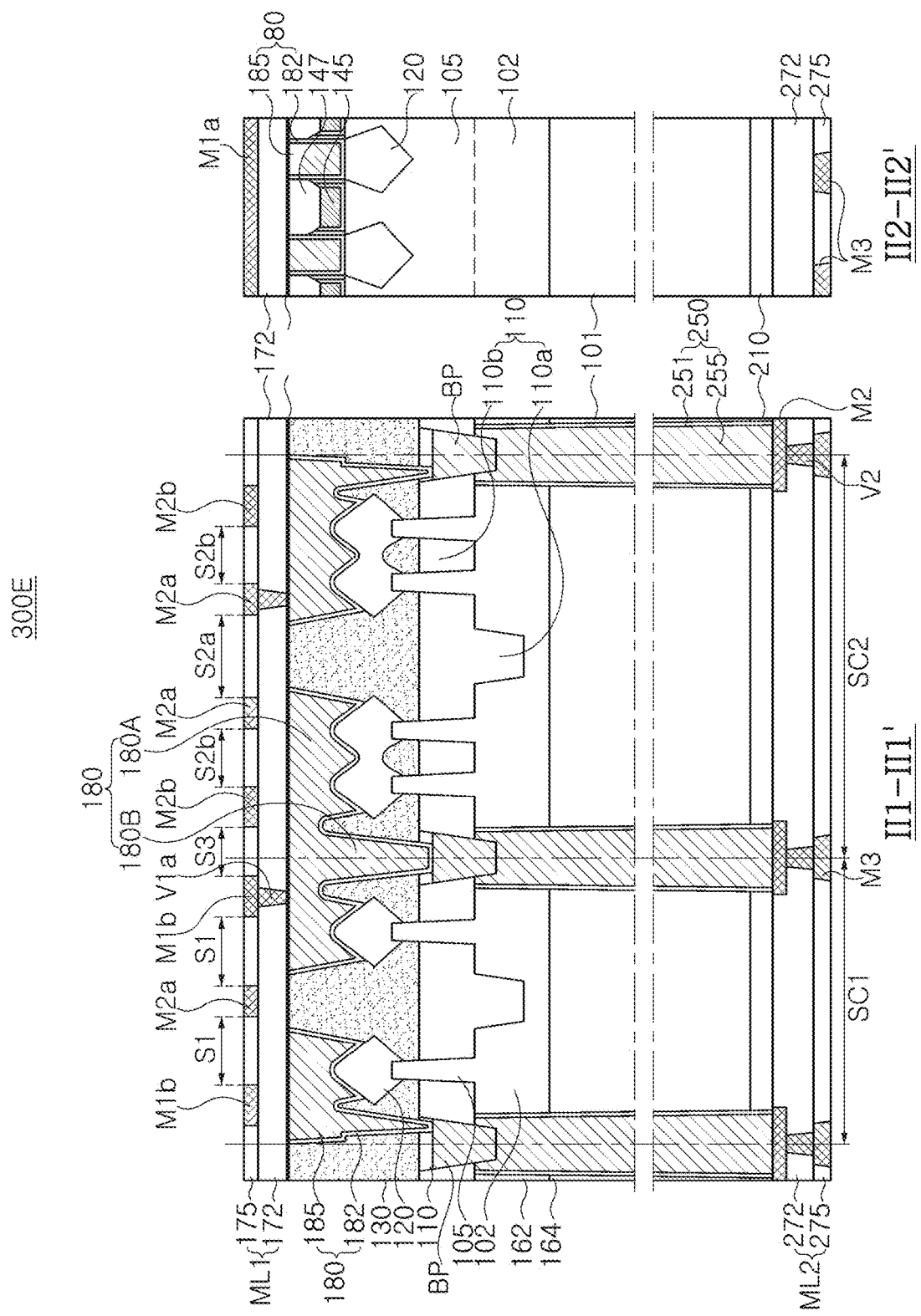
FIG. 14 provides cross-sectional view of the semiconductor device of FIG. 13, taken along lines II1-II1' and II2-II2'.

FIG. 13 is a plan view illustrating a semiconductor device according to some example embodiments, and FIG. 14 is a cross-sectional view of the semiconductor device of FIG. 13 taken along lines II1-II1' and II2-II2'.

Referring to FIGS. 13 and 14, a semiconductor device 300E according to some example embodiments includes two standard cells SC1 and SC2 having different tracks. In some example embodiments, the power line and the dummy gate structure may be implemented similarly to other example embodiments (FIG. 10). As illustrated in FIG. 13, the power line is implemented as a buried power line BP, and the three gate structures extend over two standard cells arranged in the second direction, and may include three gate structures GS1, GS2 and GS3 including two dummy gate structures DG.

The first and second standard cells SC1 and SC2 employed in some example embodiments may be understood as standard cells disposed in adjacent rows while having different heights CH1 and CH2.

Similar to other example embodiments, wiring lines of the first and second standard cells SC1 and SC2 may have the arrangement in which at least one of a pitch, an spacing, and a line width is different from the others. For example, the first standard cell SC1 includes three wiring lines M1a and M1b, and the wiring line M1a located at the center may have a line width W1a different from a line width W1b of the wiring lines M1b disposed on both sides thereof. Alternatively or additionally, the spacings S2a and S2b of the adjacent wiring lines M1a and M1b may be arranged such that the spacing S1 and the pitch P1a may be the same.

The second standard cell SC2 has four wiring lines M2a and M2b, two wiring lines M2a adjacent to the center have a first line width W2a, and two other wiring lines M2b may have a second line width W1b greater than the first line width W1a. The four wiring lines M2a and M2b may be arranged at different spacings S2a and S2b and at different pitches P2a and P2b.

In some example embodiments, since the power line employs a buried power line BP, the wiring lines M1b and M2b adjacent to the boundary CB between the first and second standard cells SC1 and SC2 may be arranged at a constant spacing S3 and pitch P3 to be located closer to each other without power lines.

Each standard cell may include a different number of active patterns 105. For example, the number of active patterns 105 of a standard cell may be changed depending on cell heights. In some example embodiments, as illustrated in FIGS. 13 and 14, the first standard cell SC1 having the first cell height CH1 employs one active pattern 105 in each active region 102, a total of two active patterns 105, while the second standard cell SC2 having a second cell height CH2 greater than the first cell height CH1 employs two active patterns 105 in each active region 102, a total of four active patterns 105.

Referring to FIG. 14, the buried power lines BP may be arranged in the first direction D1 at boundaries between the first standard cell SC1 and the second standard cell SC2. The contact structure 180 may include a first contact portion 180A connected to the source/drain region 120, and a second contact portion 180B connected to the first contact portion 180A and connected to the buried power line BP. The second contact portion 180B may extend deeper than the first contact portion 180A and may be electrically connected to the buried power line BP. The contact structure 180 may be connected to the first wiring portion ML1 constituting the BEOL.

In some example embodiments, the first wiring portion ML1 includes a plurality of low dielectric layers 172 and 175, first wiring lines M1a and M1b, second wiring lines M2a and M2b, and a conductive via V1, similar to other example embodiments. Some wiring lines M1b and M2a may be connected to some contact structures 180 through conductive vias V1a and V1b, respectively.

In this manner, by implementing the power line as a buried power line, the degree of freedom in designing the wiring line may be greatly improved. In other example embodiments (especially, see FIG. 10B), wiring lines are arranged at a constant pitch, and two wiring lines adjacent to the cell boundary may have a distance (e.g., half) smaller than the pitch, through which the wiring lines between adjacent standard cells may be arranged at the same pitch.

Figure 15A:
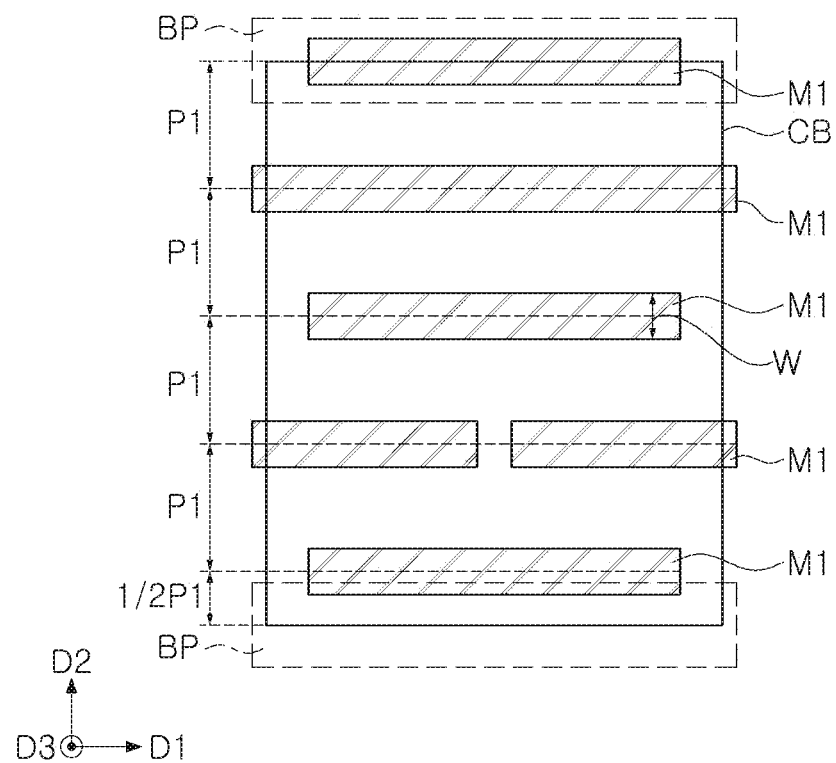
FIGS. 15A and 15B are plan views illustrating semiconductor devices according to various example embodiments.
Figure 15B:
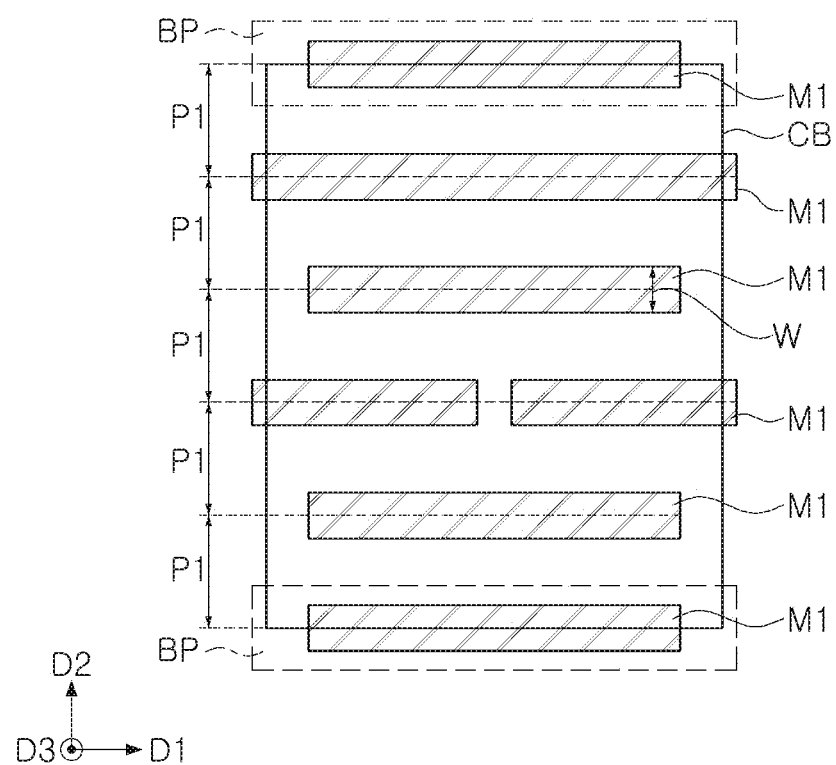

As described above, according to the introduction of the buried power line, the position of the wiring line adjacent to the cell boundary may be variously changed. FIGS. 15A and 15B illustrate semiconductor devices 300F and 300F, for example, standard cells according to various arrangement examples.

Referring to FIG. 15A, wiring lines M1 are arranged at a constant first pitch P1 within the cell boundary CB, but one of the two wiring lines M1 adjacent to an edge may be positioned on a cell boundary CB, for example, to overlap the buried power line BP, and the other may be disposed to have a distance (e.g., ½P1) smaller than the first pitch P1, with the cell boundary CB.

Referring to FIG. 15B, the wiring lines M1 are arranged at a constant first pitch P1 within the cell boundary CB, and two wiring lines M1 adjacent to an outer side are on the cell boundary CB, for example, may be positioned to overlap the buried power line BP.

As described above, since the buried power line BP is not located in the BEOL structure like the wiring lines, wiring lines located at the same level may be designed more freely, and standard cells having the same number of tracks (the number of wiring lines or the like) may be implemented to have a relatively lower cell height, or a larger number of tracks may be secured in standard cells having the same cell height.

Figure 16:
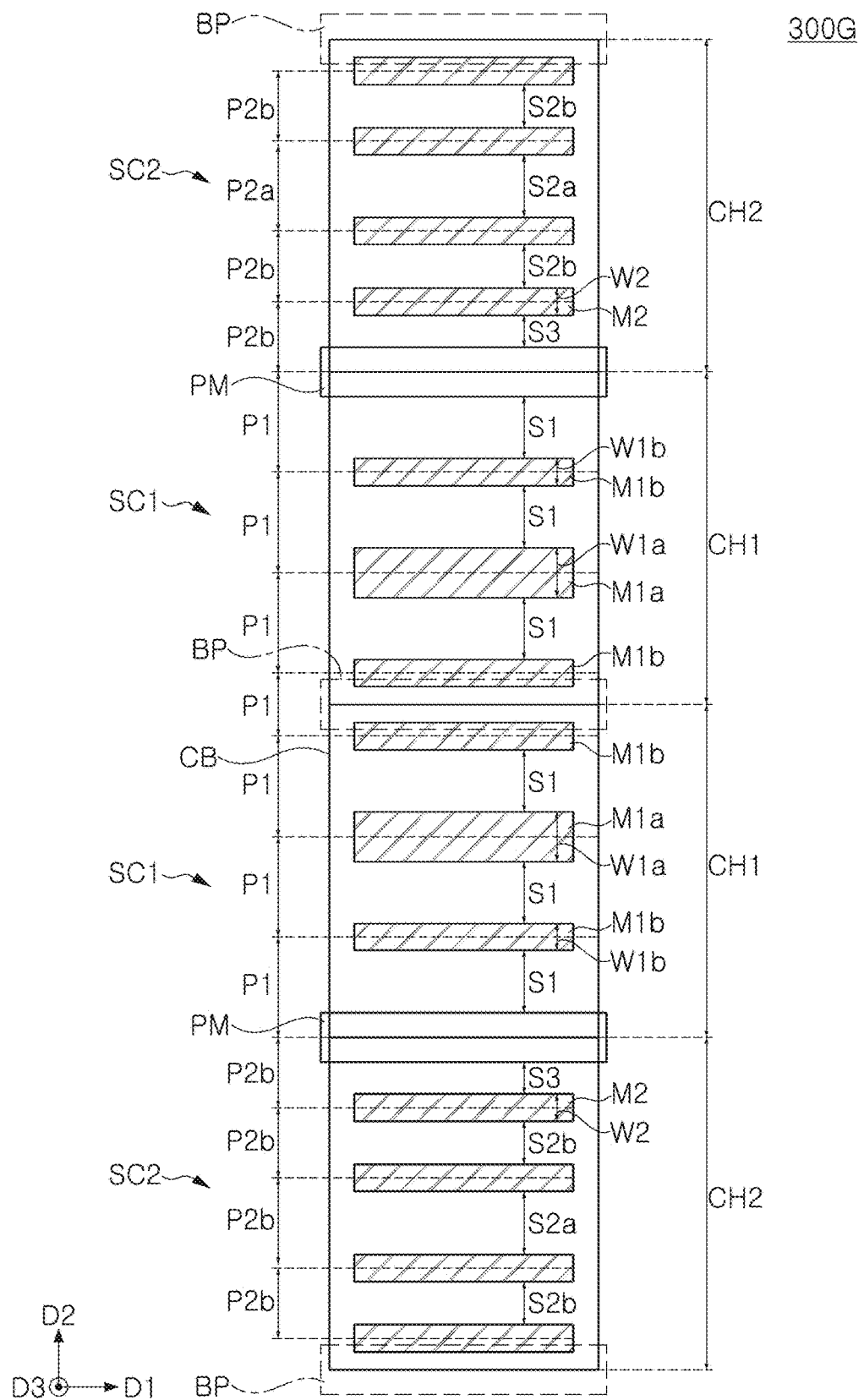
FIG. 16 is a plan view illustrating a semiconductor device according to some example embodiments.

FIG. 16 is a plan view illustrating a semiconductor device according to some example embodiments.

Referring to FIG. 16, a semiconductor device 300G according to some example embodiments may include four standard cells SC1 and SC2 arranged in a second direction D2, and a plurality of power lines PM and BP respectively extending in the first direction D1 along boundaries of the four standard cells SC1 and SC2.

The plurality of power lines PM and BP employed in some example embodiments include two first power lines PM disposed on a level above, e.g. higher than or further away from, the upper surface of the contact structure, and three second power lines BP buried in the active region (also referred to as "buried power line") (see FIGS. 11 and 14). In this manner, the wiring lines M1a, M1b and M2 may be disposed at the same level as the first power lines PM, but may be disposed on a level lower than the second power lines BP.

The first power lines PM and the second power lines BP may be alternately disposed in the second direction D2. A contact structure (refer to "180" in FIGS. 11 and 14) connected to the source/drain regions of the active pattern is connected to the first power lines PM by a conductive via, or may be connected to the second power lines BP by an extension portion (see "180B" in FIGS. 11 and 14) extended in the second direction D2.

The two first standard cells SC1 may each include three first wiring lines M1a and M1b arranged at the same spacing S1 and having different line widths W1a and W1b. The two second standard cells SC2 are arranged at different spacings S2a and S2b, and may include four second wiring lines M2 having the same line widths W1a and W1b.

In some example embodiments, the first wiring lines M1a and M1b and the first power lines PM may be arranged at a constant pitch P1 over two adjacent first standard cells SC1.

For example, the first wiring lines M1b adjacent to the boundary of two adjacent first standard cells SC1 may also be arranged at the same pitch P1 as other first wiring lines. In the second standard cell SC2, the spacing P2a between the second wiring lines M2 located at the center may be greater than the spacing P2b with the other second wiring lines M2. The wiring lines M2 adjacent to the first power lines PM may be arranged at a pitch P2 equal to the pitch and a spacing S3 different from the spacings.

In this manner, some of the power lines may be replaced with buried power lines BP, and a combination of these power lines may have various types of wiring line arrangements.

As set forth above, a semiconductor device having improved integration may be provided by using standard cells of relatively various standards (e.g., sizes) by adjusting the pitch and/or spacing of metal lines (e.g., power lines and wiring lines). In detail, standard cells of various cell heights may be effectively introduced in the process of designing and manufacturing semiconductor devices. In some example embodiments, the height of a standard cell that may be introduced may be reduced by employing the power line as a buried power line.

At least some components described herein may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments have been illustrated and described above, it will be apparent to those of ordinary skill in the art that modifications and variations could be made without departing from the scope of the present inventive concept as defined by the appended claims.

What is claimed is:

1. A semiconductor device comprising:
   a substrate having an active region;
   a plurality of standard cells on the active region of the substrate, the plurality of standard cell arranged in a plurality of rows, the plurality of rows extending in a first direction, the plurality of standard cells each including
   an active pattern extending in the first direction,
   a gate structure intersecting the active pattern and extending in a second direction that intersects the first direction,
   a plurality of source/drain regions in the active pattern with one of the plurality of source/drain regions on one side of the gate structure and another of the plurality of source/drain regions on another side of the gate structure, and
   contact structures respectively connected to the source/drain regions;
   a plurality of power supply lines disposed on a lower surface of the substrate;
   a plurality of conductive through structure extending from the lower surface of the substrate toward an upper surface of the substrate, and respectively connected to the plurality of power supply lines; and
   a plurality of buried power lines buried in the active region and respectively extending in the first direction along boundaries of the plurality of standard cells, the plurality of buried power lines respectively connected to the plurality of conductive through structure and supplying power to the plurality of standard cells through the conductive structures,
   wherein each of the plurality of standard cells further includes a plurality of wiring lines extending in the first direction and arranged in the second direction, and
   at least some wiring lines of the plurality of wiring lines in at least one standard cell among the plurality of standard cells are arranged such that at least one of a pitch, a spacing, or a line width is different from a respective one of a pitch, a spacing, or a line width of a neighboring standard cell.

2. The semiconductor device of claim 1, wherein the at least some of the plurality of wiring lines have the same line width.

3. The semiconductor device of claim 1, wherein the at least some of the plurality of wiring lines have different line widths.

4. The semiconductor device of claim 1, wherein
   each of the plurality of standard cells has a first conductivity-type device area and a second conductivity-type device area, the first conductivity-type device are arranged in the second direction with respect to the second conductivity-type device area, and
   standard cells of two adjacent rows among the plurality of rows are arranged such that same conductivity-type device areas are adjacent to each other.

5. The semiconductor device of claim 4, wherein in the at least one standard cell, two wiring lines adjacent to a center of the plurality of wiring lines have a spacing greater than a spacing between other neighboring wiring lines of the plurality of wiring lines.

6. The semiconductor device of claim 4, wherein the plurality of wiring lines in the at least one standard cell are arranged symmetrically with respect to a central line that extends in the first direction.

7. The semiconductor device of claim 1, wherein at least one of the plurality of standard cells has a number of wiring lines different from a number of wiring lines of other standard cells of the plurality of standard cells located in the same row.

8. The semiconductor device of claim 1, wherein at least one of the plurality of standard cells includes first neighboring wiring lines of the at least some neighboring wiring lines which are arranged such that at least one of a pitch, a spacing, or a line width is different from second neighboring wiring lines of the at least some neighboring wiring lines of other standard cells located in the same row.

9. The semiconductor device of claim 1, wherein the plurality of standard cells include a first group of standard cells arranged in a first row and having a first height defined in the second direction, and a second group of standard cells arranged in a second row and having a second height defined in the second direction, the second height being different from the first height.

10. The semiconductor device of claim 9, wherein the plurality of buried power lines include a shared power line shared by the first group of standard cells and the second group of standard cells, the shared power line being shared at a boundary between the first group of standard cells and the second group of standard cells.

11. The semiconductor device of claim 9, further comprising:

a dummy pattern on the active region, the dummy pattern between the first group of standard cells and the second group of standard cells, the dummy pattern extending in the first direction.

12. The semiconductor device of claim 1, wherein at least some of the contact structures has an extension portion extending in the second direction and connected to the buried power line.

13. The semiconductor device of claim 12, wherein the at least some neighboring wiring lines of the plurality of wire lines of two standard cells adjacent to the buried power line in the second direction, among the plurality of standard cells, are arranged at a same pitch and/or at a same spacing.

14. The semiconductor device of claim 1, wherein
the active pattern includes an active fin protruding from the active region in a third direction, and
the gate structure includes a gate electrode intersecting the active pattern and a gate insulating layer between the gate electrode and the active pattern, the gate electrode extending in the second direction.

15. The semiconductor device of claim 1, wherein
the active pattern has a portion protruding from the active region in a third direction,
the semiconductor device further includes a plurality of channel layers on the active pattern, the plurality of channel layers arranged to be spaced apart from each other in the third direction, the plurality of channel layers extending in the first direction, and
the gate structure includes a gate electrode surrounding the plurality of channel layers, and a gate insulating layer between the plurality of channel layers and the gate electrode and between the active pattern and the gate electrode, the gate electrode extending in the second direction.

16. A semiconductor device comprising:
a substrate having an active region;
a first group of standard cells arranged in a first row on the active region of the substrate and having a first height defined in a column direction;
a second group of standard cells arranged in a second row on the active region of the substrate, the second group of standard cells having a second height defined in the column direction, the second height different from the first height; and
a plurality of power supply lines disposed on a lower surface of the substrate, and respectively extending along boundaries of the first group of standard cells and the second group of standard cells,
a plurality of conductive through structure extending from the lower surface of the substrate toward an upper surface of the substrate, and respectively connected to the plurality of power supply lines; and
a plurality of buried conductive structures disposed on the substrate, and respectively connected to the plurality of conductive through structures; wherein
the plurality of buried conductive structures supply power to the first and second groups of standard cells,
the first and second groups of standard cells each include a plurality of wiring lines extending in the row direction and arranged in the column direction, and
at least some neighboring wiring lines of the plurality of wiring lines in at least one standard cell of the first and second groups of standard cells are arranged at different spacings and/or pitches.

17. The semiconductor device of claim 16, wherein
the wiring lines located in the at least one standard cell are arranged in the row direction symmetrically up and down based on a center line, and
a spacing between wiring lines adjacent to the center line, among the wiring lines within the at least one standard cell, is greater than a spacing of other wiring lines.

18. The semiconductor device of claim 16, wherein
the second height is greater than the first height, and
a number of wiring lines of the plurality of wiring lines in the second group of standard cells is greater than a number of wiring lines of the plurality of wiring lines in the first group of standard cells.

19. The semiconductor device of claim 16, further comprising:
an extended standard cell arranged over the first row and the second row and having a height corresponding to a sum of the first height and the second height.

20. A semiconductor device comprising:
a substrate having an active region;
a plurality of standard cells on the active region of the substrate, the plurality of standard cell arranged in a plurality of rows, the plurality of rows extending in a first direction, the plurality of standard cells each including
an active pattern protruding from the active region and extending in the first direction,
a gate electrode surrounding the active pattern and extending in a second direction that intersects the first direction,
a gate dielectric layer between the active pattern and gate electrode source/drain regions connecting the active pattern, and
contact structures respectively connected to the source/drain regions;
a plurality of power supply lines disposed on a lower surface of the substrate;
a plurality of conductive through structure extending from the lower surface of the substrate toward an upper surface of the substrate, and respectively connected to the plurality of power supply lines; and
a plurality of buried power lines buried in the active region and respectively extending in the first direction along boundaries of the plurality of standard cells, the plurality of buried power lines respectively connected to the plurality of conductive through structure and supplying power to the plurality of standard cells through the conductive structures,
wherein each of the plurality of standard cells further includes a plurality of wiring lines extending in the first direction and arranged in the second direction, and
at least some wiring lines of the plurality of wiring lines in at least one standard cell among the plurality of standard cells are arranged such that at least one of a pitch, a spacing, or a line width is different from a respective one of a pitch, a spacing, or a line width of a neighboring standard cell.

* * * * *